(12) United States Patent
Lee et al.

(10) Patent No.: US 10,437,121 B2
(45) Date of Patent: Oct. 8, 2019

(54) LIQUID CRYSTAL DISPLAY

(71) Applicant: Samsung Display Co., Ltd., Yongin (KR)

(72) Inventors: Cheol-Gon Lee, Seoul (KR); Mee Hye Jung, Suwon-si (KR); In-Jae Hwang, Suwon-si (KR); Jang Mi Kang, Bucheon-si (KR); Hyun Joon Kim, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 152 days.

(21) Appl. No.: 14/671,712

(22) Filed: Mar. 27, 2015

(65) Prior Publication Data

US 2016/0131951 A1    May 12, 2016

(30) Foreign Application Priority Data

Nov. 11, 2014    (KR) .................. 10-2014-0156414

(51) Int. Cl.
*G02F 1/1362*    (2006.01)
*G02F 1/1368*    (2006.01)
(Continued)

(52) U.S. Cl.
CPC ...... *G02F 1/136213* (2013.01); *G02F 1/1368* (2013.01); *G02F 1/13624* (2013.01);
(Continued)

(58) Field of Classification Search
CPC ......... G02F 1/136213; G02F 1/134309; G02F 1/13624; G02F 1/136286; G02F 1/1368;
(Continued)

(56) References Cited

U.S. PATENT DOCUMENTS 7,916,224 B2    3/2011    Chung
8,237,878 B2    8/2012    Shim et al.
(Continued)

FOREIGN PATENT DOCUMENTS

KR    10-2008-0037132    4/2008
KR    10-2013-0139548    12/2013
KR    10-2014-0021105    2/2014

OTHER PUBLICATIONS

European Search Report dated Jan. 8, 2016, in European Application No. 15172477.0-1904.

*Primary Examiner* — Angela K Davison
(74) *Attorney, Agent, or Firm* — H.C. Park & Associates, PLC

(57) ABSTRACT

A liquid crystal display includes: a gate line extending in a first direction; a first data line and a second data line extending in a second direction; a thin film transistor (TFT) including a gate electrode connected to the gate line, a source electrode connected to the first data line, and a drain electrode; a vertical storage electrode line extending between the first and second data lines; a passivation layer disposed on the TFT and the vertical storage electrode line; an insulating layer disposed on the passivation layer; and a subpixel electrode disposed on the insulating layer, connected to the drain electrode, wherein the vertical storage electrode line includes an expansion, the insulating layer includes an opening exposing a portion of the passivation layer overlapping the expansion, and wherein the subpixel electrode includes a protrusion overlapping the expansion, a reinforced storage capacitor being formed between the protrusion and the expansion.

19 Claims, 16 Drawing Sheets

(51) Int. Cl.
*G02F 1/1333* (2006.01)
*G02F 1/1343* (2006.01)
*H01L 27/12* (2006.01)
*G02F 1/136* (2006.01)

(52) U.S. Cl.
CPC .. *G02F 1/133345* (2013.01); *G02F 1/133377* (2013.01); *G02F 1/134309* (2013.01); *G02F 1/136286* (2013.01); *H01L 27/1255* (2013.01); *G02F 2001/13606* (2013.01); *G02F 2001/134345* (2013.01); *G02F 2001/136222* (2013.01)

(58) Field of Classification Search
CPC ......... G02F 1/133512; G02F 1/133514; G02F 2001/13622; G02F 2001/134345; G02F 2001/13606; G02F 2001/136222; G02F 2201/123; G02F 2201/30; H01L 27/1255
USPC .............................................. 349/39, 48, 144
See application file for complete search history.

(56) References Cited

U.S. PATENT DOCUMENTS

| | | | |
|---|---|---|---|
| 2009/0122248 A1* | 5/2009 | Kim | G02F 1/134309 349/139 |
| 2009/0146152 A1* | 6/2009 | Kwak | G02F 1/136209 257/72 |
| 2010/0045883 A1 | 2/2010 | Kim et al. | |
| 2010/0045884 A1 | 2/2010 | Ahn et al. | |
| 2013/0128197 A1* | 5/2013 | Lee | G02B 5/201 349/106 |
| 2013/0208206 A1* | 8/2013 | Park | H01L 29/41733 349/46 |

* cited by examiner

LIQUID CRYSTAL DISPLAY

CROSS-REFERENCE TO RELATED APPLICATION

This application claims priority from and the benefit of Korean Patent Application No. 10-2014-0156414, filed on Nov. 11, 2014, which is hereby incorporated by reference for all purposes as if fully set forth herein.

BACKGROUND

1. Field

Exemplary embodiments relate to display technology, and, more particularly, to liquid crystal displays.

2. Discussion of the Background

A display device, such as a liquid crystal display (LCD) and an organic light emitting diode display, generally includes a display panel including a plurality of pixels including switching elements and a plurality of signal lines, and a data driver applying a gray voltage corresponding to an input image signal applied to a data line as a data signal.

A liquid crystal display may include a display panel with field generating electrodes, such as a pixel electrode, a common electrode, and the like, and a liquid crystal layer. The liquid crystal display generates an electric field in the liquid crystal layer by applying a voltage to the field generating electrodes to adjust alignment of liquid crystal molecules of the liquid crystal layer and control polarization of incident light, thereby displaying images.

The liquid crystal display may be formed by a thin film transistor array panel and an opposing display panel. In the thin film transistor array panel, various lines, for example, a gate line configured to transmit a gate signal and a data line configured to transmit a data signal are formed, and a thin film transistor connected with the gate line and the data line, and a pixel electrode connected with the thin film transistor may be formed. In the opposing display panel, a light blocking member, a color filter, and an opposing electrode may be formed. The light blocking member, the color filter, and the opposing electrode may be formed on the thin film transistor array panel.

The thin film transistor is a three-terminal element including a gate electrode connected to the gate line to receive the gate signal, a source electrode connected to the data line to receive the data signal, and a drain electrode facing the source electrode with respect to the gate electrode and connected to a pixel electrode. The gate signal includes a gate-on voltage turning on the thin film transistor and a gate-off voltage turning off the thin film transistor. At the start of a frame, the pixel electrode receives the data voltage through the thin film transistor turned on by the gate-on voltage applied to the gate electrode to display an image at luminance corresponding to the data voltage. Thereafter, the thin film transistor is turned off by the gate-off voltage applied to the gate electrode and maintains the data voltage applied to the pixel electrode for the remaining frames.

When the level of the gate signal applied to the gate electrode is changed from the gate-on voltage to the gate-off voltage, the voltages of the drain electrode and the pixel electrodes may drop by a parasitic capacitance between the gate electrode and the drain electrode of the thin film transistor. The voltage changed above is called a kickback voltage. The kickback voltage may vary according to a size of the parasitic capacitance between the gate electrode and the drain electrode of the thin film transistor and the data voltage.

The liquid crystal display may have a deteriorated side visibility compared to a front visibility. In order to improve the visibility, a pixel may be divided into a plurality of subpixels with adjusted voltages applied to the plurality of subpixels.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments relate to a liquid crystal display with improved visibility and high resolution having improving image quality by reducing a kickback voltage.

Additional aspects will be set forth in the detailed description which follows, and, in part, will be apparent from the disclosure, or may be learned by practice of the inventive concept.

According to one or more exemplary embodiments, a liquid crystal display, includes: a gate line extending in a first direction; a first data line extending in a second direction different from the first direction; a second data line extending in the second direction; a first thin film transistor including a first gate electrode connected to the gate line, a first source electrode connected to the first data line, and a first drain electrode; a second thin film transistor including a second gate electrode connected to the gate line, a second source electrode connected to the first data line, and a second drain electrode; a third thin film transistor including a third gate electrode connected to the gate line, a third source electrode connected to the second drain electrode, and a third drain electrode; a vertical storage electrode line extending between the first data line and the second data line, the vertical storage electrode line being connected to the third drain electrode; a passivation layer disposed on the first thin film transistor, the second thin film transistor, the third thin film transistor, and the vertical storage electrode line; an insulating layer disposed on the passivation layer; a first subpixel electrode disposed on the insulating layer and connected to the first drain electrode; and a second subpixel electrode disposed on the insulating layer and connected to the second drain electrode, wherein the vertical storage electrode line includes a first expansion adjacent to the gate line, wherein the insulating layer includes a first opening exposing a portion of the passivation layer, the portion of the passivation layer overlapping the first expansion, and wherein the second subpixel electrode includes a first protrusion overlapping the first expansion in the first opening, a reinforced storage capacitor being formed between the first protrusion and the first expansion.

According to one or more exemplary embodiments, a liquid crystal display includes: a gate line extending in a first direction; a first data line extending in a second direction different from the first direction; a second data line extending in the second direction; a thin film transistor including a gate electrode connected to the gate line, a source electrode connected to the first data line, and a drain electrode; a vertical storage electrode line extending between the first data line and the second data line, the vertical storage electrode line being configured to transfer a determined voltage; a passivation layer disposed on the thin film transistor and the vertical storage electrode line; an insulating layer disposed on the passivation layer; and a subpixel electrode disposed on the insulating layer, the subpixel electrode being connected to the drain electrode, wherein the vertical storage electrode line includes an expansion adjacent to the gate line, wherein the insulating layer includes an opening exposing a portion of the passivation layer, the portion of the passivation layer overlapping the expansion, and wherein the subpixel electrode includes a protrusion overlapping the expansion in the opening, a reinforced storage capacitor being formed between the protrusion and the expansion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
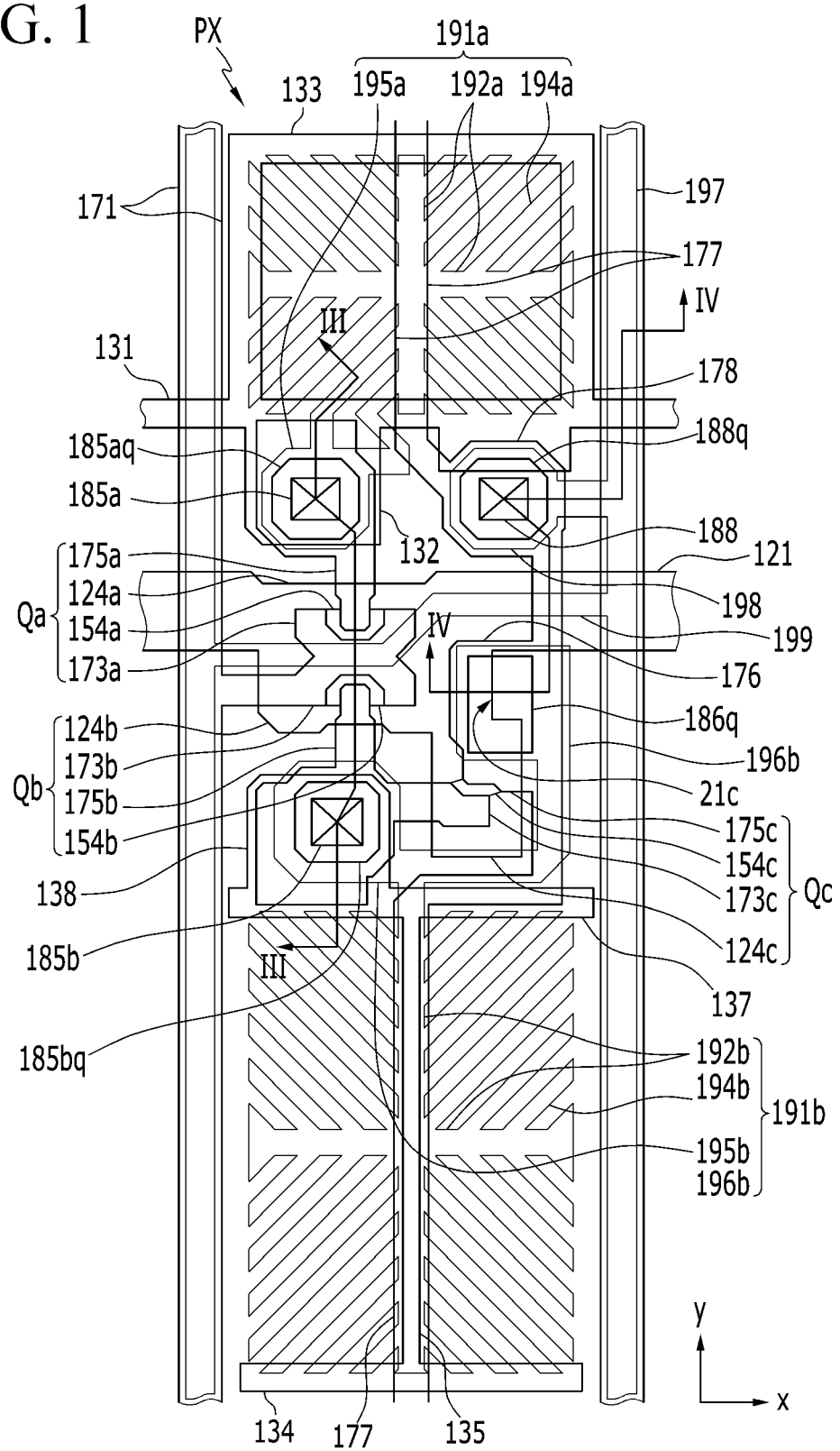
FIG. 1 is a layout view of a pixel of a liquid crystal display according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to plan and/or sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A liquid crystal display according to one or more exemplary embodiments will be described with reference to FIGS. 1, 2, 3, and 4.

The liquid crystal display according to one or more exemplary embodiments include a plurality of signal lines and a plurality of pixels PXs connected thereto. The plurality of pixels PXs may be disposed in a display area in which most of the images are displayed, the plurality of pixels PXs may be arranged substantially in a matrix form. FIG. 1 illustrates a structure of approximately one pixel.

Referring to FIGS. 1, 2, 3, and 4, a liquid crystal display may include a substrate 110, a plurality of thin films laminated thereon, and a plurality of liquid crystal molecules 31 disposed in a sealed space.

The substrate 110 may include at least one of glass, plastic, and the like which has an insulating property. A gate conductor including a gate line 121 and a horizontal storage electrode line 131 are disposed on the substrate 110.

The gate line 121 mainly extends in a horizontal direction, that is, an x-axis direction and is configured to transfer a gate signal. The gate line 121 includes a first gate electrode 124a, a second gate electrode 124b, and a third gate electrode 124c. The first gate electrode 124a, the second gate electrode 124b, and the third gate electrode 124c may protrude to any one side from a main body of the gate line 121 mainly extending in the x-axis direction. The first gate electrode 124a and the second gate electrode 124b are connected to each other to form one electrode. The third gate electrode 124c is disposed at the left side or the right side of the first and second gate electrodes 124a and 124b. The third gate electrode 124c may protrude from the gate line 121 longer than the protruding lengths of the first and second gate electrodes 124a and 124b.

Figure 2:
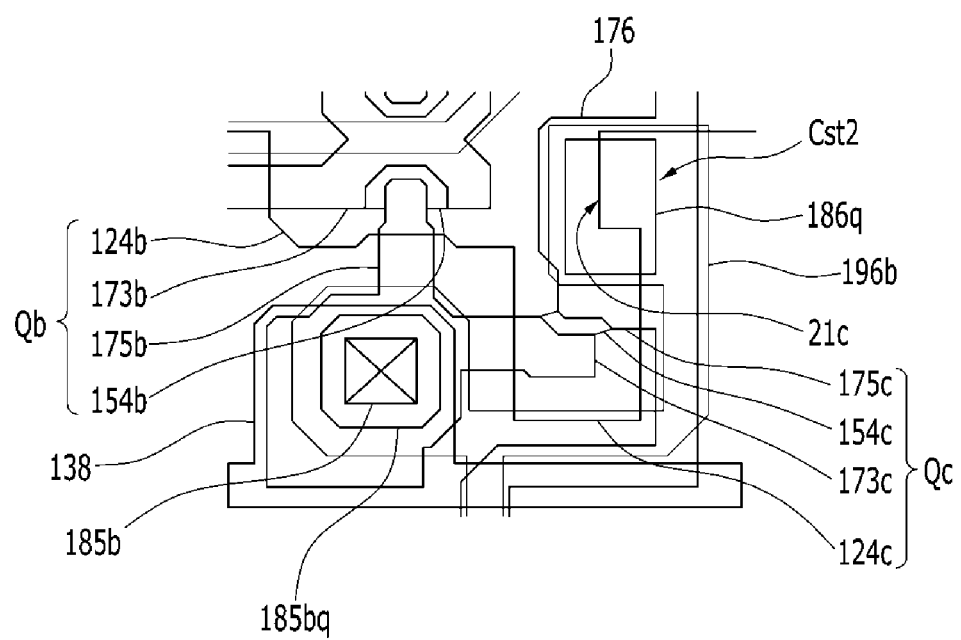
FIG. 2 is an enlarged layout view of a part of a pixel of the liquid crystal display illustrated in FIG. 1, according to one or more exemplary embodiments.

As illustrated in FIGS. 1 and 2, the third gate electrode 124c may include at least one depression 21c with an edge of the third gate electrode 124c is curved inward. The horizontal storage electrode line 131 extends to be substantially parallel to the gate line 121. A determined voltage may be applied to the horizontal storage electrode line 131. The horizontal storage electrode line 131 may include a plurality of storage electrodes 132, 133, 134, 135, 137, and 138, protruding from the main body of the horizontal storage electrode line 131 extending in the x-axis direction. The storage electrode 132 may protrude from the main body of the horizontal storage electrode line 131 in one direction. The storage electrode 133 may extend in a different direction from a direction in which the storage electrode 132 protrudes and form a closed loop together with the main body of the horizontal storage electrode line 131. The storage electrode 134 may extend substantially in the horizontal direction. The storage electrode 135 may extend upward from an approximately center of an upper side of the storage electrode 134. The storage electrode 137 may be connected to an end of the storage electrode 135 and extend substantially in the horizontal direction, that is, an x-axis direction. The storage electrode 138 may protrude from the storage electrode 137 in the direction storage electrode 133 extends.

A gate insulating layer 140 is disposed on the gate conductor. The gate insulating layer 140 may be made of an inorganic insulating material such as silicon nitride (SiNx) and silicon oxide (SiOx), and may be formed as a single layer or a multilayer.

A semiconductor layer including a first semiconductor 154a, a second semiconductor 154b, and a third semiconductor 154c is disposed on the gate insulating layer 140. The first semiconductor 154a is disposed on the first gate electrode 124a, the second semiconductor 154b is disposed on the second gate electrode 124b, and the third semiconductor 154c is disposed on the third gate electrode 124c. The first semiconductor 154a, the second semiconductor 154b, and the third semiconductor 154c may be connected to each other. The semiconductor layer may include at least one of amorphous silicon, polycrystalline silicon, metal oxide, and the like.

An ohmic contact 164 may be disposed on the semiconductor layer. The ohmic contact 164 may include at least one of silicide, n+ hydrogenated amorphous silicon including high concentration of doped n-type impurities, and the like. The ohmic contact 164 may be omitted.

A data conductor including a data line 171 including a first source electrode 173a and a second source electrode 173b, a first drain electrode 175a, a second drain electrode 175b, a third source electrode 173c, a third drain electrode 175c, and a vertical storage electrode line 177 is disposed on the ohmic contact 164 and the gate insulating layer 140.

The data line 171 may transfer a data signal and mainly extend in a vertical direction, that is, a y-axis direction crossing the gate line 121 and the horizontal storage electrode line 131.

The first source electrode 173a and the second source electrode 173b may be connected to each other. The first source electrode 173a and the first drain electrode 175a are disposed facing each other with respect to the first gate electrode 124a, and the second source electrode 173b and the second drain electrode 175b are disposed facing each other with respect to the second gate electrode 124b. More specifically, the first source electrode 173a may be disposed facing the first drain electrode 175a disposed above, and the second source electrode 173b may be disposed facing the second drain electrode 175b disposed below. Accordingly, the first drain electrode 175a and the second drain electrode 175b may be disposed at an opposite side with respect to the gate line 121 and disposed substantially symmetrical to each other, and the first drain electrode 175a and the second drain electrode 175b may include portions extending substantially in the y-axis direction.

The third source electrode 173c is connected with second drain electrode 175b. The third source electrode 173c may include a portion extending substantially in the x-axis direction. The third source electrode 173c and the third drain electrode 175c are disposed facing each other with respect to third gate electrode 124c.

The vertical storage electrode line 177 extends substantially in the vertical direction, that is, the y-axis direction. Particularly, the vertical storage electrode line 177 may extend along an approximate center line between adjacent data lines 171.

The vertical storage electrode line 177 may be curved at least once around the gate line 121 and the horizontal storage electrode line 131, and may include an expansion 178 and an expansion 176.

The expansion 176 is disposed adjacent to the gate line 121 and may partially overlap the third gate electrode 124c and the depression 21c of the third gate electrode 124c. The expansion 176 is disposed substantially adjacent to the third drain electrode 175c in the y-axis direction, and the expansion 176 is connected to the third drain electrode 175c. That is, the expansion 176 is disposed at a side where the third source electrode 173c and the third drain electrode 175c are disposed with respect to the gate line 121. As seen in FIGS. 1 and 2, the expansion 176 may be disposed below the gate line 121.

The expansion 178 may be disposed facing the expansion 176, the gate line 121 being disposed between the expansion 176 and the expansion 178. As seen in FIGS. 1 and 2, the expansion 178 may be disposed above the gate line 121.

The vertical storage electrode line 177 extends downward from the expansion 178 and crosses the gate line 121 to form the expansion 176 and may extend further in a y-axis direction. The vertical storage electrode line 177 may be curved at least once around the storage electrode 137 and again extend along the approximate center line between the adjacent data lines 171.

The vertical storage electrode line 177 is configured to transfers a determined voltage such as a common voltage Vcom.

The expansion 176 connected with the third drain electrode 175c may structurally partially overlap with the third gate electrode 124c. In a liquid crystal display with a higher resolution, a distance between the adjacent data lines 171 is decreased, and as a result, it is not easy to position the expansion 176 to avoid the third gate electrode 124c. Accordingly, the expansion 176 may partially overlap with the third gate electrode 124c. As seen in FIGS. 1 and 2, since the depression 21c of the third gate electrode 124c is disposed at the place where the expansion 176 is disposed, an area of the third gate electrode 124c overlapping with the expansion 176 may be minimized and the parasitic capacitance between the third gate electrode 124c and the expansion 176 may be minimized, thereby reducing a delay of the gate signal.

The first gate electrode 124a, the first source electrode 173a, and the first drain electrode 175a form a first thin film transistor Qa together with the first semiconductor 154a, the second gate electrode 124b, the second source electrode 173b, and the second drain electrode 175b form a second thin film transistor Qb together with the second semiconductor 154b, and the third gate electrode 124c, the third source electrode 173c, and the third drain electrode 175c form the third thin film transistor Qc together with the third semiconductor 154c.

A lower passivation layer 180p is disposed on the data conductor and exposed portions of the semiconductors 154a, 154b, and 154c. The lower passivation layer 180p may include an inorganic insulating material. The lower passivation layer 180p includes a contact hole 185a exposing the first drain electrode 175a, a contact hole 185b exposing the second drain electrode 175b, and a contact hole 188 exposing the expansion 178 of the vertical storage electrode line 177.

An insulating layer 180q is disposed on the lower passivation layer 180p. The insulating layer 180q may include an organic insulating material and have a substantially flat upper surface.

The insulating layer 180q includes openings 185aq, 185bq, and 188q corresponding to the contact holes 185a, 185b, and 188, respectively, and an opening 186q corresponding to the expansion 176 of the vertical storage electrode line 177. The opening 185aq may include an edge side surrounding the contact hole 185a, the opening 185bq may include an edge side surrounding the contact hole 185b, and the opening 188q may include an edge side surrounding the contact hole 188.

An upper passivation layer 180r may be disposed on the insulating layer 180q. The upper passivation layer 180r may include an inorganic insulating material. The upper passivation layer 180r includes contact holes corresponding to the contact holes 185a, 185b, and 188 of the lower passivation layer 180p, respectively. The corresponding contact holes of the lower passivation layer 180p and the upper passivation layer 180r may be simultaneously patterned. The upper passivation layer 180r may be omitted.

A pixel electrode including a first subpixel electrode 191a and a second subpixel electrode 191b, and a voltage transfer line 197 are disposed on the upper passivation layer 180r.

The first subpixel electrode 191a and the second subpixel electrode 191b may be disposed to face each other with respect to the gate line 121. The first subpixel electrode 191a and the second subpixel electrode 191b are mainly disposed between two adjacent data lines 171 and each may have a quadrangular shape. An area of the first subpixel electrode 191a may be smaller than that of the subpixel electrode 191b, but it is not limited thereto.

The first subpixel electrode 191a includes a stem 192a having substantially a cross shape, a plurality of minute branches 194a extending outward from the stem 192a, and a protrusion 195a extending toward the first drain electrode 175a. The protrusion 195a is physically and electrically connected with the first drain electrode 175a through the contact hole 185a. The vertical storage electrode line 177 may extend overlapping with a portion of the stem 192a extending in a y-axis direction.

The first subpixel electrode 191a overlaps with the horizontal storage electrode line 131 and the storage electrodes 132 and 133 included in the horizontal storage electrode line 131 to form a first storage capacitor which serves to maintain the applied voltage. The horizontal storage electrode line 131 and the storage electrode 133 may overlap with the edge of the first subpixel electrode 191a and form a closed loop along the edge of the first subpixel electrode 191a, but the shape is not limited thereto. The storage electrode 132 may overlap with the protrusion 195*a* of the first subpixel electrode 191*a*.

The second subpixel electrode 191*b* includes a stem 192*b* having substantially a cross shape, a plurality of minute branches 194*b* extending outward from the stem 192*b*, a protrusion 195*b* extending toward the second drain electrode 175*b*, and a storage protrusion 196*b* extending toward the expansion 176. The vertical storage electrode line 177 may extend overlapping with a portion of the stem 192*b* extending in a y-axis direction. The protrusion 195*b* is physically and electrically connected with the second drain electrode 175*b* through the contact hole 185*b*.

The second subpixel electrode 191*b* overlaps with the storage electrodes 134, 135, 137, and 138 to form a second storage capacitor which serves to maintain the applied voltage. The storage electrode 134 may mainly overlap with a lower edge of the second subpixel electrode 191*b*, the storage electrode 135 may overlap with a vertical stem of the cross stem 192*b* of the second subpixel electrode 191*b*, the storage electrode 137 may overlap with an upper edge of the second subpixel electrode 191*b*, and the storage electrode 138 may overlap with the protrusion 195*b* of the second subpixel electrode 191*b*.

The storage protrusion 196*b* of the second subpixel electrode 191*b* extends toward the expansion 176 of the vertical storage electrode line 177 to form an expansion and overlaps with the expansion 176 to form a reinforced storage capacitor Cst2 reinforcing the second storage capacitor. The reinforced storage capacitor Cst2 may be substantially disposed between the gate line 121 and the third thin film transistor Qc.

Since the storage protrusion 196*b* and the expansion 176 mainly overlap with each other in the opening 186*q* of the insulating layer 180*q*, a distance between the storage protrusion 196*b* and the expansion 176 may be decreased. Since the storage protrusion 196*b* and the expansion 176 are two terminals of the reinforced storage capacitor Cst2 without an organic material between the two terminals, the capacitance of the reinforced storage capacitor Cst2 may be increased.

Accordingly, a storage capacitance which is configured to maintain the data voltage received to the second subpixel electrode 191*b* through the second thin film transistor Qb may be increased. Accordingly, a ratio of the parasitic capacitance between the second gate electrode 124*b* and the second drain electrode 175*b* of the second thin film transistor Qb, to the entire capacitance formed by the second subpixel electrode 191*b* and the second drain electrode 175*b* connected to the second subpixel electrode 191*b*, may be further decreased.

In the high-resolution liquid crystal display, the aperture ratio of each pixel PX is decreased, and thus a ratio of the parasitic capacitance between the second gate electrode 124*b* and the second drain electrode 175*b* to the entire capacitance formed by the second subpixel electrode 191*b* and the second drain electrode 175*b* may be increased. According to one or more exemplary embodiments, the ratio of the parasitic capacitance between the second gate electrode 124*b* and the second drain electrode 175*b* and/or the third source electrode 173*c* to the entire capacitance formed by the second subpixel electrode 191*b* and the second drain electrode 175*b* may be decreased by the reinforced storage capacitor Cst2. In the second drain electrode 175*b* and the third source electrode 173*c* which are electrically and physically connected with the second subpixel electrode 191*b*, if the gate signal transferred to the second gate electrode 124*b* drops from the gate-on voltage Von to the gate-off voltage Voff, the voltage of the second subpixel electrode 191*b* may drop from capacitive coupling caused by the parasitic capacitance, which is called a kickback voltage. According to one or more exemplary embodiments, the relative ratio of the parasitic capacitance between the second gate electrode 124*b* and the second drain electrode 175*b* and/or the third source electrode 173*c* to the entire capacitance formed by the second subpixel electrode 191*b* and the second drain electrode 175*b* may be decreased by the reinforced storage capacitor Cst2 reinforcing the second storage capacitor, and as a result, the kickback voltage may be decreased.

Furthermore, in liquid crystal displays including multiple thin film transistors to improve visibility, an area occupied by the thin film transistors may be increased, and therefore, the aperture ratio of the pixel PX may be relatively decreased, thus resulting in increasing the kickback voltage. According to one or more exemplary embodiments, a relative ratio of the parasitic capacitance between the second gate electrode 124*b* and the second drain electrode 175*b* to the entire capacitance formed by the second subpixel electrode 191*b* and the second drain electrode 175*b* may be reduced, and thus, the magnitude of the kickback voltage may be reduced by the reinforced storage capacitor Cst2.

Since the magnitude of the kickback voltage may be reduced, a voltage drop applied to the second subpixel electrode 191*b* may be decreased, and liquid crystal display may display an image with luminance of improved accuracy. Particularly, when an image with high gray scale value is displayed, the change of luminance due to the kickback voltage of the voltage of the first subpixel electrode 191*b* may be reduced. Since the first subpixel electrode 191*b* occupies a large part of the luminance change of the pixel PX, the deterioration of the luminance of the high-gray image may be reduced and the deterioration of the image quality may be reduced.

Furthermore, in the one or more exemplary embodiments, which includes the first to third thin film transistors Qa, Qb, and Qc to improve visibility, the area occupied by the thin film transistors may be increased, and therefore, the aperture ratio of the pixel PX may be relatively decreased, thus resulting in increasing the kickback voltage. According to one or more exemplary embodiments, a relative ratio of the parasitic capacitance between the second gate electrode 124*b* and the second drain electrode 175*b* to the entire capacitance formed by the second subpixel electrode 191*b* and the second drain electrode 175*b* may be reduced, and thus, the magnitude of the kickback voltage may be reduced by the reinforced storage capacitor Cst2.

Referring to FIG. 1, the reinforced storage capacitor Cst2 may be disposed adjacent to the first and second thin film transistors Qa and Qb in the x-axis direction, and may be disposed adjacent to the third thin film transistor Qc in the y-axis direction, to improve a space application in the high-resolution liquid crystal display. In this case, the reinforced storage capacitor Cst2 partially overlaps with the gate line 121 and/or the third gate electrode 124*c*. Also, as illustrated in FIG. 1, the depression 21*c* is disposed on the third gate electrode 124*c* to reduce the parasitic capacitance between the gate line 121 and the vertical storage electrode line 177, thereby reducing the delay of the gate signal.

The portion extending substantially in the y-axis direction of the storage protrusion 196*b* of the second subpixel electrode 191*b* may overlap with the vertical storage electrode line 177.

The voltage transfer line 197 overlaps with the data line 171 and includes a main body extending in the y-axis direction along the data line 171, a protrusion 198, and a connecting portion 199 extending in the x-axis direction. A width of the y-axis direction of the main body of the voltage transfer line 197 may be smaller than the width of the data line 171.

The protrusion 198 extends substantially in the x-axis direction from the main body to form an expansion overlapping the expansion 178 of the vertical storage electrode line 177. The protrusion 198 is physically and electrically connected to the expansion 178 of the vertical storage electrode line 177 through the contact hole 188. Accordingly, the voltage transfer line 197 may be configured to transfer a determined voltage such as a common voltage Vcom transferred by the vertical storage electrode line 177.

The connecting portion 199 connects the adjacent voltage transfer lines 197 and may extend substantially in the x-axis direction. The connecting portion 199 may include a portion overlapping with the gate line 121. Exemplary embodiments are not limited to the pixel illustrated in FIG. 1, and thus, the connecting portion 199 may be disposed in a peripheral area which is not the display area, and may be omitted.

Since the voltage transfer line 197 is disposed on the data line 171, an effect by the voltage change of the data line 171 may be reduced, and the crosstalk between the pixel electrode of another pixel PX adjacent to the data line 171 and the data lien 171 may be reduced.

The first and second subpixel electrodes 191a and 191b and the voltage transfer line 197 may include a transparent conductive material such as indium tin oxide (ITO) and indium zinc oxide (IZO).

Meanwhile, the vertical storage electrode line 177 described above may be curved at least once between the first subpixel electrode 191a and the second subpixel electrode 191b in order to maximize the space application within a limited space. In detail, the vertical storage electrode line 177 may be curved at least once around the edge of the first subpixel electrode 191a, and extend between the first subpixel electrode 191a and the second subpixel electrode 191b and may be curved at least once around the edge of the second subpixel electrode 191b.

An alignment layer 11 may be disposed on the pixel electrode and the voltage transfer line 197. The alignment layer 11 may be a vertical alignment layer and include an alignment material such as polyamic acid, polysiloxane, and polyimide. It is noted, however, that the alignment layer 11 may be omitted based on design considerations of the liquid crystal display.

An opposing electrode 270 is disposed on the first and second subpixel electrodes 191a and 191b, facing and spaced apart from the first and second subpixel electrodes 191a and 191b. A determined voltage such as a common voltage Vcom may be applied to the opposing electrode 270 and generate an electric field in a microcavity 305 with the first and second subpixel electrodes 191a and 191b.

The opposing electrode 270 may not be disposed in an area where the first to third thin film transistors Qa, Qb, and Qc, the gate line 121, and the like are disposed, which is the light blocking area between the first subpixel electrode 191a and the second subpixel electrode 191b, through which light may be blocked, and may have a shape extended in the x-axis direction. Accordingly, the opposing electrode 270 may include a plurality of portions which are arranged spaced apart from each other in the y-axis direction.

The opposing electrode 270 may be physically and electrically connected with the voltage transfer line 197 at a boundary of two adjacent pixels PX in the x-axis direction adjacent to the data line 171, and the opposing electrode 270 may be configured to transfer and/or receive the common voltage Vcom. Accordingly, even though the opposing electrode 270 includes the plurality of portions spaced apart from each other in the y-axis direction, each portion of the opposing electrode 270 may be configured to receive the common voltage Vcom through the voltage transfer line 197 which extends in the y-axis direction, and as a result, the entire portion of the opposing electrode 270 may be configured to transfer the common voltage Vcom at a determined level.

The opposing electrode 270 may include a transparent metal material such as indium tin oxide (ITO) and indium zinc oxide (IZO).

A microcavity 305 is disposed between the first and second subpixel electrodes 191a and 191b, and the opposing electrode 270. Particularly, most of the opposing electrode 270 is disposed overlapping the microcavity 305. The signal lines such as the gate line 121 and the data line 171 may be disposed between two adjacent microcavities 305.

A liquid crystal layer including a plurality of liquid crystal molecules 31 is disposed in the microcavity 305. The liquid crystal layer has dielectric anisotropy. The liquid crystal layer may have, for example, negative dielectric anisotropy. The liquid crystal molecule 31 may be initially aligned in a substantially vertical direction to the substrate 110 without the electric field applied in the microcavity 305. The alignment direction of the liquid crystal molecules 31 may be changed depending on the electric field generated by both the pixel electrode and the opposing electrode 270, and as a result, a polarization state of the light passing through the liquid crystal layer may be changed.

An alignment layer 21 may be disposed on a surface of the opposing electrode 270 facing the microcavity 305. The alignment layer 21 may be a vertical alignment layer and may include an alignment material such as polyamic acid, polysiloxane, and polyimide. The first alignment layer 11 and the second alignment layer 21 may be connected to each other at the edge of the microcavity 305. It is noted, however, that the alignment layer 21 may be omitted.

A first insulating layer 350 is disposed on the opposing electrode 270. The first insulating layer 350 may include an inorganic insulating material such as silicon nitride (SiNx) and silicon oxide (SiOx), but may also be omitted.

A roof layer 360 is disposed on the first insulating layer 350. The roof layer 360 may include an organic material. The microcavity 305 is disposed below the roof layer 360, and the roof layer 360 may be hardened by a curing process to maintain the shape of the microcavity 305.

The roof layer 360 is extended in the x-axis direction, and may not be disposed in at least a part of the light blocking area between the first subpixel electrode 191a and the second subpixel electrode 191b. Each microcavity 305 is disposed below the roof layer 360 corresponding to each of the first subpixel electrode 191a and the second subpixel electrode 191b. The microcavity 305 may not be disposed below the roof layer 360 between the two adjacent pixels PX in the x-axis direction. Instead, the opposing electrode 270 may contact the voltage transfer line 197 between the microcavities 305 adjacent in the x-axis direction.

Since the roof layer 360 may not be disposed in at least a part of the light blocking area between the first subpixel electrode 191a and the second subpixel electrode 191b, the roof layer 360 may include an injection hole (not illustrated) exposing a part of the microcavity 305 corresponding to each of the first and second subpixel electrodes 191a and 191b. The injection hole facing the first subpixel electrode 191a may face an injection hole facing the second subpixel electrode 191b. During a manufacturing process of the liquid crystal display, the microcavity 305 may be exposed by the injection hole and as a result, and an alignment material to form the alignment layers 11 and 21 and/or a liquid crystal material may be injected into the microcavity 305 through the injection hole.

A second insulating layer 370 may be disposed on the roof layer 360. The second insulating layer 370 may include an inorganic insulating material such as silicon nitride (SiNx) and silicon oxide (SiOx). The second insulating layer 370 may cover the upper side and the side of the roof layer 360. The second insulating layer 370 may protect the roof layer 360, but may be omitted if necessary.

An overcoat 390 is disposed on the second insulating layer 370. The overcoat 390 may cover the injection hole (not shown) through which the microcavity 305 may be exposed. The overcoat 390 may seal the microcavity 305 so that the liquid crystal molecules 31 of the liquid crystal layer disposed in the microcavity 305 may not leak to the outside. Since the overcoat 390 contacts the liquid crystal layer, the overcoat 390 may be made of a material which does not react with the liquid crystal material of the liquid crystal layer. For example, the overcoat 390 may include parylene and the like.

Figure 3:
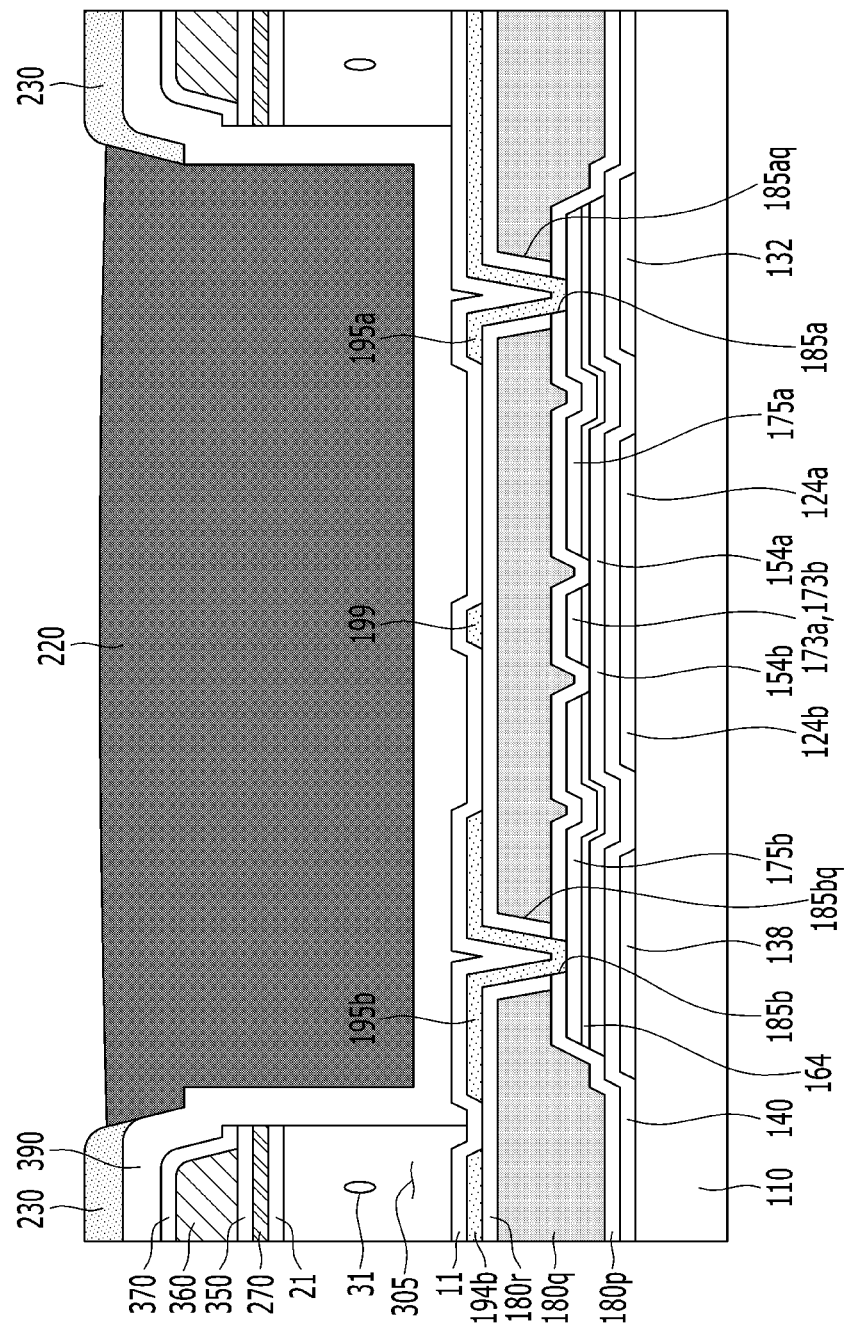
FIG. 3 is a cross-sectional view of the liquid crystal display of FIG. 1 taken along sectional line III-III, according to one or more exemplary embodiments.
Figure 4:
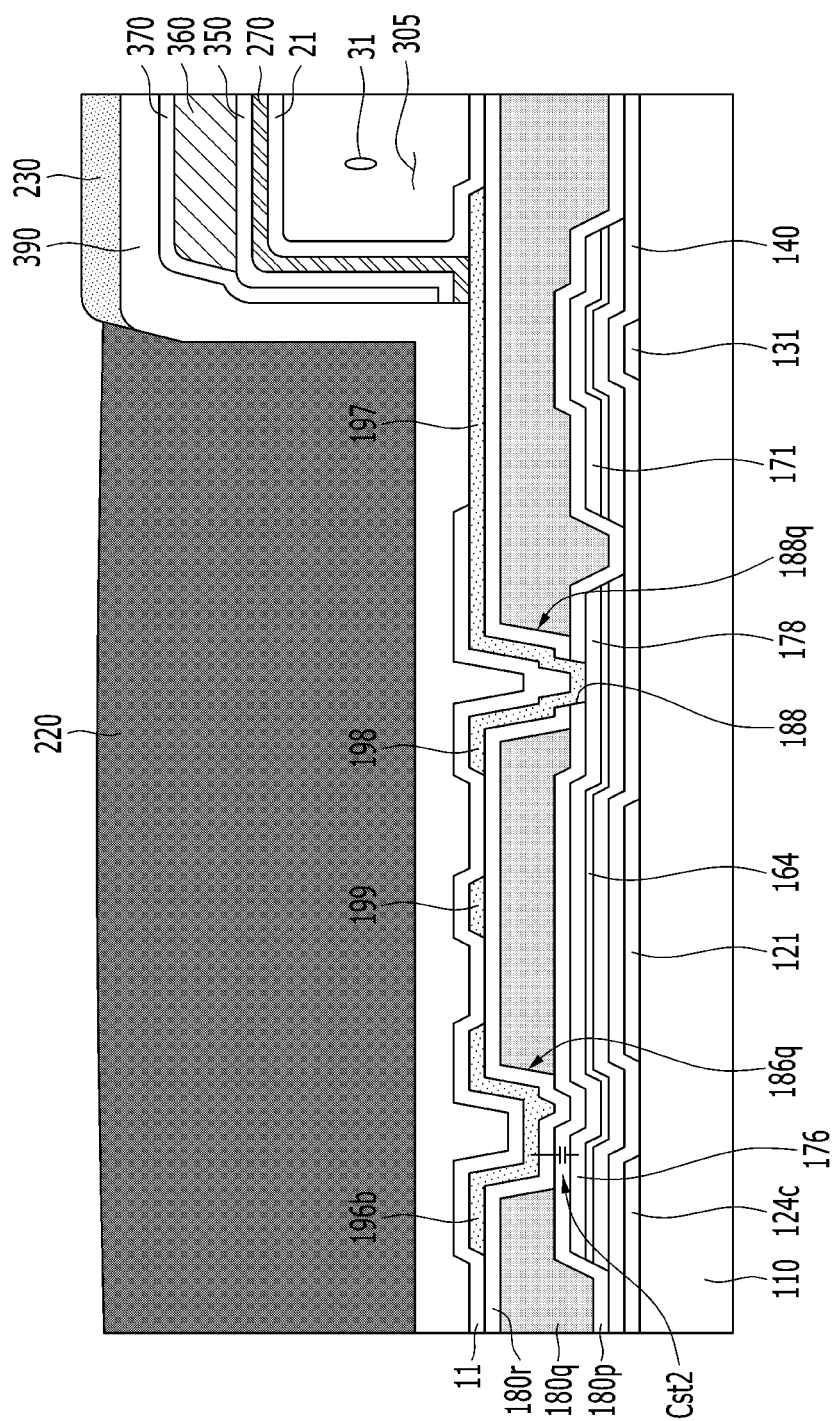
FIG. 4 is a cross-sectional view of the liquid crystal display of FIG. 1 taken along sectional line IV-IV, according to one or more exemplary embodiments.

The liquid crystal display may further include a light blocking member 220 and a color filter 230. The light blocking member 220 and/or the color filter 230 may be disposed on one of many layers of the liquid crystal display. For example, the light blocking member 220 and the color filter 230 may be disposed on the overcoat 390 as illustrated in FIGS. 3 and 4.

The color filter 230 may be disposed corresponding to each of the first subpixel electrode 191a and the second subpixel electrode 191b. Each color filter 230 may display combination of at least one of a primary color, such as red, green, and blue colors and cyan, magenta, and yellow colors, and may further include other various colors such as white. The color filter 230 may extend in a y-axis direction between two adjacent data lines 171.

The light blocking member 220 is disposed in an area where the color filters 230 are not disposed, which includes, for example, a portion of the light blocking area where the first to third thin film transistors Qa, Qb, and Qc are disposed. The light blocking member 220 may further include a portion extending along the data line 171, overlapping with the data line 171. The light blocking member 220 may limit light leakage.

The liquid crystal display may further include polarizers (not shown). For example, one polarizer may be disposed on an outer surface of the substrate 110 and another polarizer may be disposed on the overcoat 390. The polarizer may convert the polarization state of the light changed by passing through the liquid crystal layer into luminance of the light to display an image according to an image signal.

According to one or more exemplary embodiments, a pixel PX may include both the first subpixel electrode 191a and the second subpixel electrode 191b, but the exemplary embodiments are not limited thereto. A pixel PX may include one subpixel electrode, for example, the second subpixel electrode 191b, and the reinforced storage capacitor Cst2 may be disposed to reinforce the storage capacitor, such as if the third thin film transistor Qc is omitted.

Figure 5:
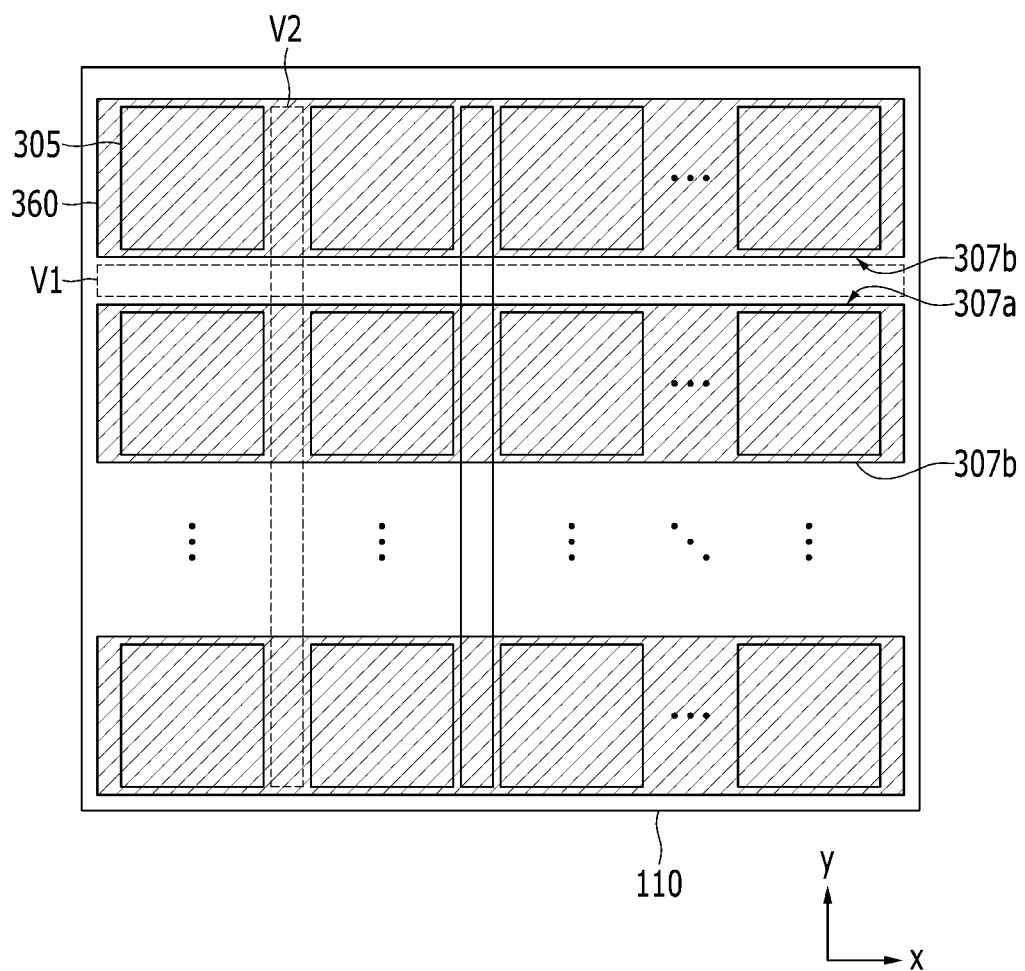
FIG. 5 is a schematic layout view of a liquid crystal display, according to one or more exemplary embodiments.

The liquid crystal display may include the roof layer 360 and the microcavity 305, and the structure of the roof layer 360 and the microcavity 305 will be described with reference to FIG. 5 in addition to FIGS. 1, 2, 3, and 4.

The liquid crystal display may include a plurality of microcavities 305 disposed on the substrate 110, covered by the roof layer 360.

The roof layers 360 extend in a row direction, which is the x-axis direction, and the plurality of microcavities 305 may be disposed below one roof layer 360. The microcavities 305 may be arranged in a matrix form, but are not limited thereto.

A first valley V1 is disposed between two microcavities 305 adjacent to each other in a column direction, which is the y-axis direction, and a second valley V2 is disposed between two microcavities 305 adjacent to each other in an x-axis direction.

The first valley V1 may also be disposed between the first subpixel electrode 191a and the second subpixel electrode 191b of the one or more exemplary embodiments illustrated in FIGS. 1, 2, 3, and 4.

Adjacent roof layers 360 may be separated from each other by the first valley V1 therebetween. Edges of the roof layer 360 contacting the first valley V1 may be exposed to the outside, and may include injection holes 307a and 307b.

A pair of injection holes 307a and 307b may be included at a pair of edges of the roof layer 360 facing each other adjacent to the first valley V1. A first injection hole 307a may expose a first edge of the microcavity 305 and a second injection hole 307b may expose a second edge of the microcavity 305. The first edge of the microcavity 305 and the second edge of the microcavity 305 may face each other with the first valley V1 therebetween.

The roof layer 360 is spaced apart from the substrate 110 to form a plurality of microcavities 305 except for where the second valley V2 is disposed. Each microcavity 305 is disposed between two adjacent second valleys V2. The roof layer 360 is disposed to cover the sides of the microcavity 305, except for the first edge and the second edge in which the injection holes 307a and 307b are respectively disposed.

The liquid crystal displays illustrated above are merely exemplary embodiments, and may be variously modified. For example, a layout of the microcavity 305, the first valleys V1, and the second valleys V2 may be modified, and the plurality of roof layers 360 may be connected at the first valleys V1, and a part of each roof layer 360 may be spaced apart from the substrate 110 at the second valley V2 and thus the adjacent microcavities 305 may be connected to each other.

A structure and an operation of the liquid crystal display according to one or more exemplary embodiments will be described with reference to FIG. 6 in addition to FIGS. 1, 2, 3, and 4.

Figure 6:
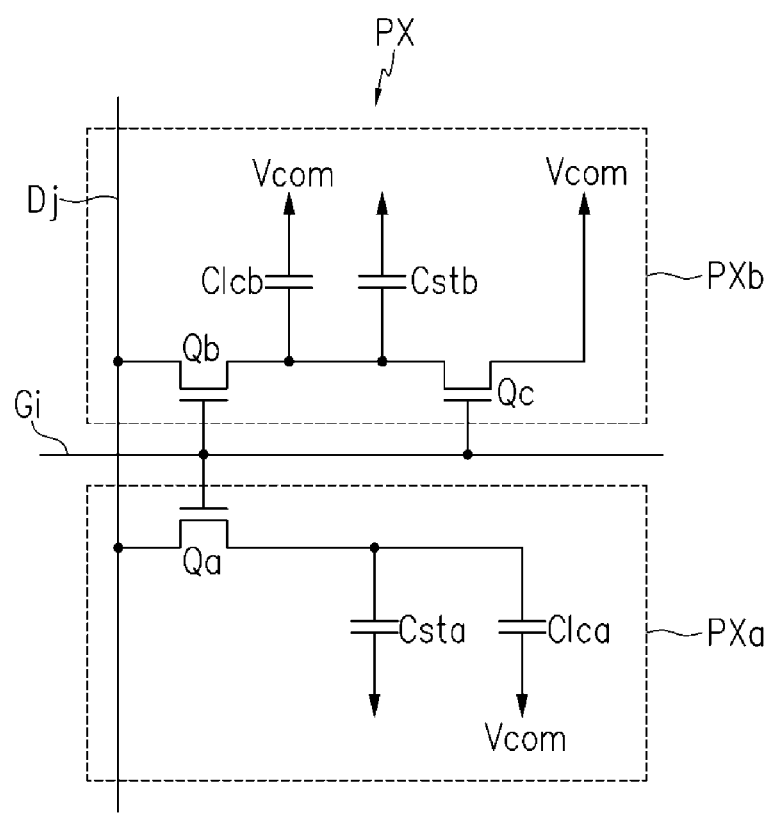
FIG. 6 is an equivalent circuit diagram of a pixel of a liquid crystal display, according to one or more exemplary embodiments.

Referring to FIG. 6, a pixel PX included in the display may include at least one switching element connected to at least one data line Dj and at least one gate line Gi and at least one pixel electrode connected to thereto. The switching element may include at least one thin film transistor and may be controlled depending on a gate signal transferred from the gate line Gi to transfer a data voltage from the data line Dj to the pixel electrode.

Each pixel PX may include a first subpixel PXa and a second subpixel PXb. The first subpixel PXa and the second subpixel PXb may display images with respect to one input image signal IDAT, according to different gamma curves and/or the same gamma curve.

The first subpixel PXa includes a first thin film transistor Qa connected to at least one data line Dj and at least one gate line Gi, a first liquid crystal capacitor Clca, and a first storage capacitor Csta connected to the first thin film transistor Qa. The second subpixel PXb includes a second thin film transistor Qb connected to at least one data line Dj and at least one gate line Gi, a third thin film transistor Qc, a second liquid crystal capacitor Clcb and a second storage capacitor Cstb connected to the second thin film transistor Qb and the third thin film transistor Qc.

The first thin film transistor Qa is a three-terminal element including a control terminal connected to the gate line Gi, an input terminal connected to the data line Dj, and an output terminal connected to the first liquid crystal capacitor Clca. The first thin film transistor Qa is controlled according to the gate signal transferred from the gate line Gi to transfer the data voltage from the data line Dj to the first liquid crystal capacitor Clca.

The second thin film transistor Qb is a three-terminal element including a control terminal connected to the gate line Gi, an input terminal connected to the data line Dj, and an output terminal connected to the second liquid crystal capacitor Clcb and an input terminal of the third thin film transistor Qc. The second thin film transistor Qb is controlled according to the gate signal transferred from the gate line Gi to transfer the data voltage from the data line Dj to the second liquid crystal capacitor Clcb.

The third thin film transistor Qc is a three-terminal element including an input terminal connected to the output terminal of the second thin film transistor Qb, an output terminal connected to a determined voltage terminal such as a common voltage Vcom, and a control terminal connected to the gate line Gi. The third thin film transistor Qc is controlled according to the gate signal transferred from the gate line Gi. If the third thin film transistor Qc and the second thin film transistor Qb are turned on, the data voltage transferred from the data line Dj is divided by the second thin film transistor Qb and the third thin film transistor Qc, and the divided data voltage may be transferred to the second liquid crystal capacitor Clcb.

Referring back to FIGS. 1, 2, 3, and 4, the first gate electrode 124*a*, the first source electrode 173*a*, and the first drain electrode 175*a* form a first thin film transistor Qa together with the first semiconductor 154*a*, the second gate electrode 124*b*, the second source electrode 173*b*, and the second drain electrode 175*b* form a second thin film transistor Qb together with the second semiconductor 154*b*, and the third gate electrode 124*c*, the third source electrode 173*c*, and the third drain electrode 175*c* form the third thin film transistor Qc together with the third semiconductor 154*c*.

The first subpixel electrode 191*a* and the opposing electrode 270 facing the first subpixel electrode 191*a* include the liquid crystal layer in the microcavity 305 as a dielectric material to form the first liquid crystal capacitor Clca, and the first subpixel electrode 191*a* overlaps with the horizontal storage electrode line 131 and the storage electrodes 132 and 133 connected with the horizontal storage electrode line 131 to form the first storage capacitor Csta, configured to help maintain the voltage applied to the first subpixel electrode 191*a*.

The second subpixel electrode 191*b* and the opposing electrode 270 facing the second subpixel electrode 191*b* include the liquid crystal layer within the microcavity 305 as a dielectric material to form the second liquid crystal capacitor Clcb, and the second subpixel electrode 191*b* overlaps with the storage electrodes 133, 135, 137, and 138 connected with the horizontal storage electrode line 131 to form the second storage capacitor Cstb, configured to help maintain the voltage applied to the second subpixel electrode 191*b*. Furthermore, the storage protrusion 196*b* of the second subpixel electrode 191*b* overlaps with the expansion 176 of the third drain electrode 175*c* configured to receive the determined voltage, such as common voltage Vcom to form reinforced storage capacitor Cst2 configured to reinforce the second storage capacitor Cstb.

Referring back to FIG. 6, the first subpixel PXa and the second subpixel PXb may display images according to different gamma curves with respect to one input image signal IDAT. The gamma curve refers to a curve representing luminance and/or transmittance for gray scale values of the input image signal IDAT.

According to one or more exemplary embodiments, the gamma curve for the second subpixel PXb may be controlled by, for example, adjusting a resistance ratio of the third thin film transistor Qc and the second thin film transistor Qb. As such, each luminance of two subpixels PXa and Pxb may be adjusted by controlling a charging voltage of the second liquid crystal capacitor Clcb. By controlling the voltage charged in the first liquid crystal capacitor Clca and the voltage charged in the second liquid crystal capacitor Clcb, an image viewed from the side may be controlled to be substantially close to an image viewed from the front side, and as a result, the side visibility may be improved.

The circuit diagram illustrated in FIG. 6 is provided to explain the exemplary structure of the liquid crystal display illustrated in FIGS. 1, 2, 3, and 4, and the exemplary embodiments are not necessarily limited to the structure of FIG. 6 and therefore, may be modified in various structures. Further, the exemplary embodiments illustrate that the one pixel PX includes two subpixels, but the present exemplary embodiments are not limited thereto, and one pixel PX may include only one subpixel, for example, the second subpixel PXb and may omit the third thin film transistor Qc.

Next, a liquid crystal display will be described with reference to FIGS. 7, 8, and 9. As previously mentioned, like elements are designated by the same reference numerals. To this end, duplicative descriptions are omitted to avoid obscuring exemplary embodiments described herein.

Figure 7:
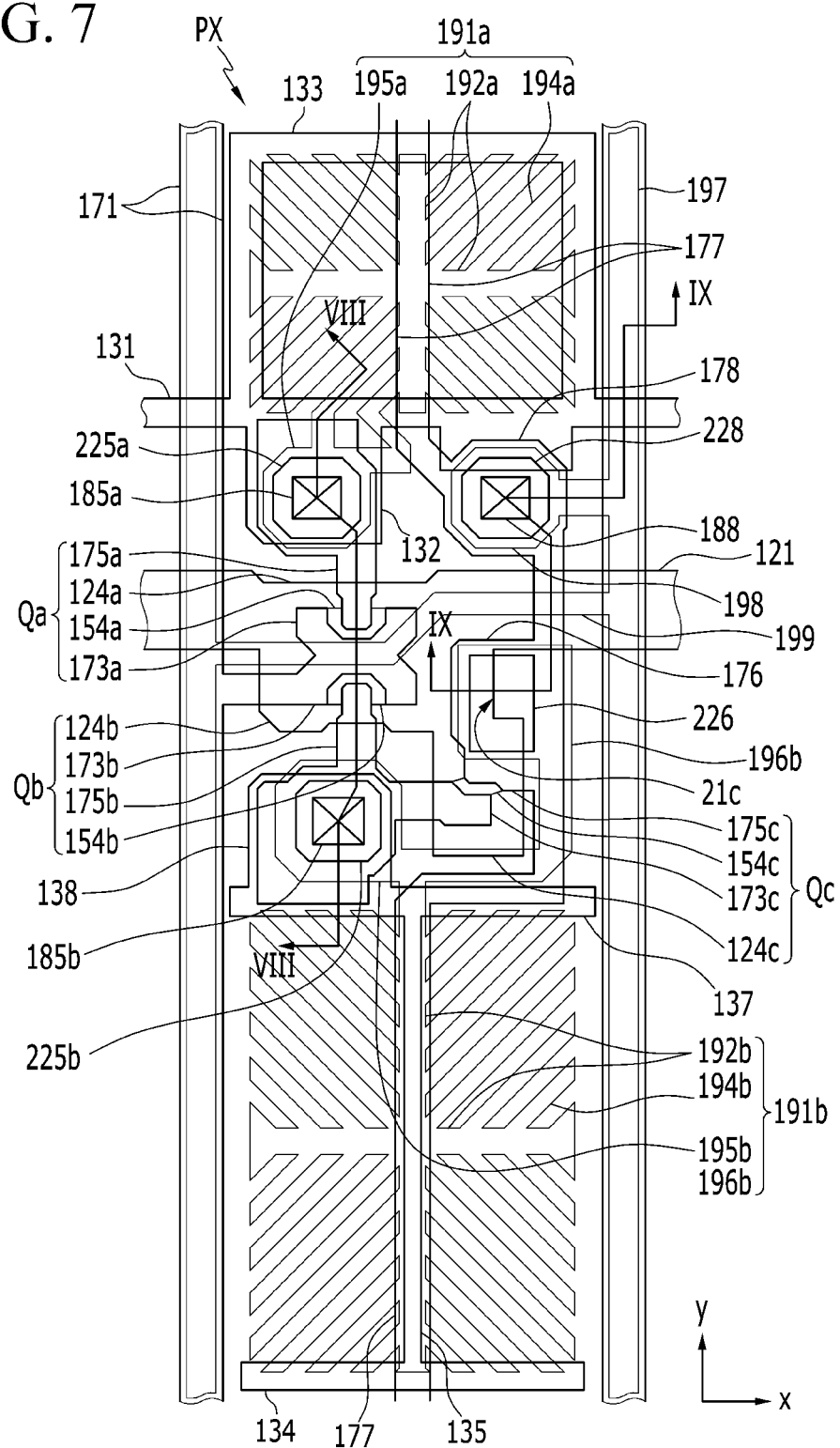
FIG. 7 is a layout view of a pixel of a liquid crystal display, according to one or more exemplary embodiments.
Figure 8:
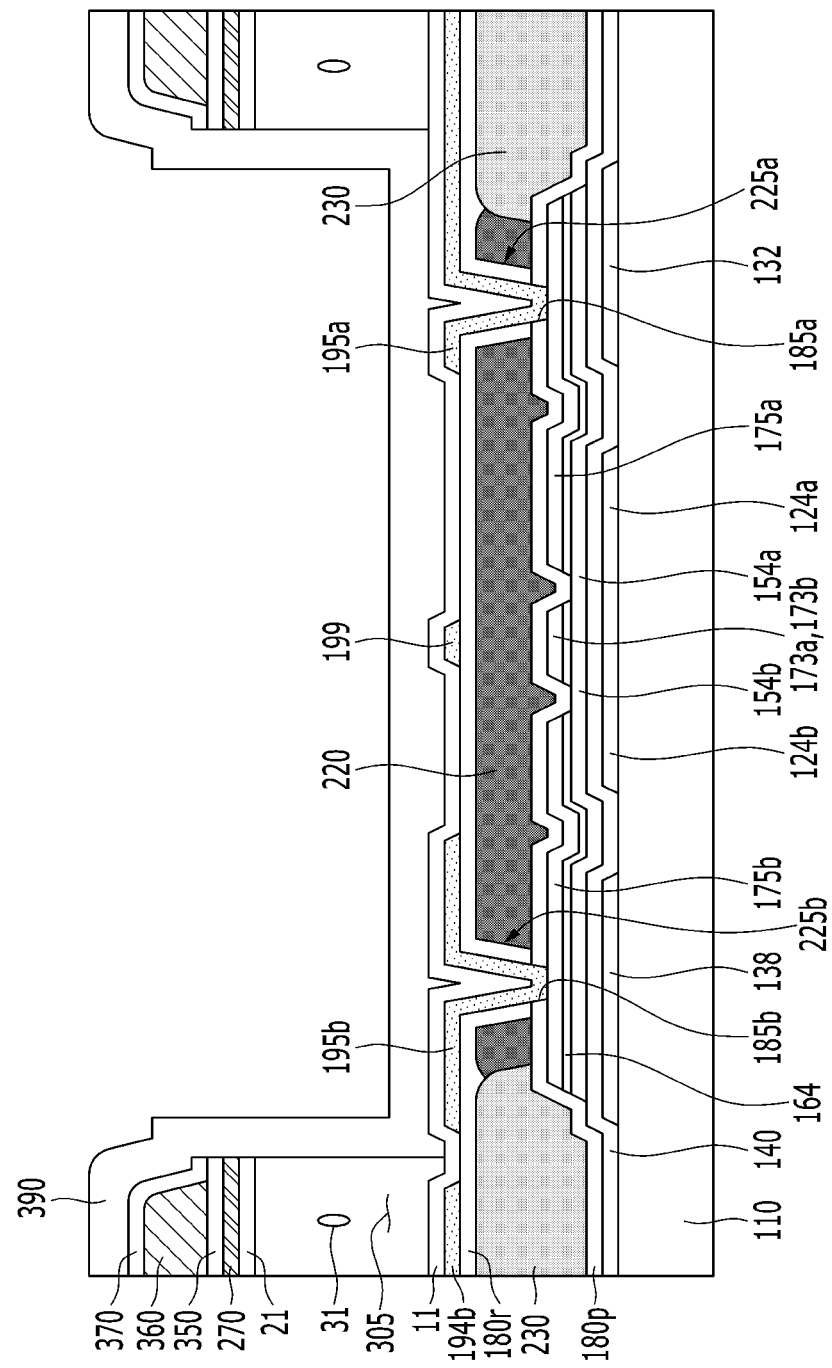
FIG. 8 is a cross-sectional view of the liquid crystal display of FIG. 7 taken along sectional line VIII-VIII, according to one or more exemplary embodiments.
Figure 9:
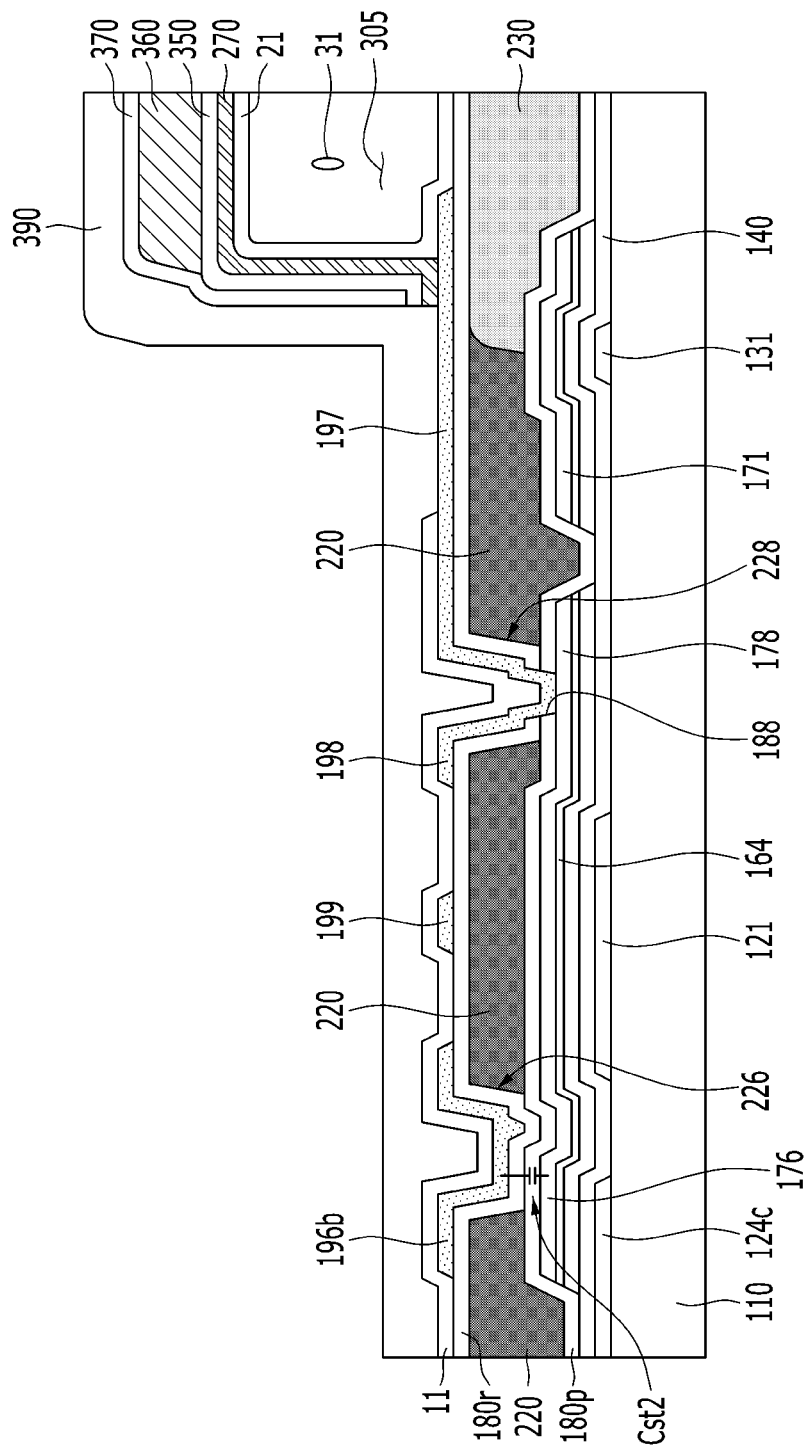
FIG. 9 is a cross-sectional view of the liquid crystal display of FIG. 7 taken along sectional line IX-IX, according to one or more exemplary embodiments.

Referring to FIGS. 7, 8, and 9, the liquid crystal display is substantially the same as illustrated in FIGS. 1, 2, 3, 4, 5, and 6 described above, except for the light blocking member 220 and the color filter 230.

The light blocking member 220 and the color filter 230 may be disposed on a lower passivation layer 180*p*. An upper passivation layer 180*r* may be disposed on the light blocking member 220 and the color filter 230. The color filter 230 may be disposed corresponding to the first subpixel electrode 191*a* and the second subpixel electrode 191*b*.

The light blocking member 220 includes a portion where the color filters 230 are not disposed, for example, a portion disposed in the light blocking area where the first to third thin film transistors Qa, Qb, and Qc are disposed. The light blocking member 220 may further include a portion extending along the data line 171, overlapping with the data line 171. The light blocking member 220 includes openings 225*a*, 225*b*, and 228 corresponding to the contact holes 185*a*, 185*b*, and 188, respectively, and an opening 226 corresponding to the expansion 176 of the third drain electrode 175*c*. The opening 225*a* may include an edge side surrounding the contact hole 185*a*, the opening 225*b* may include an edge side surrounding the contact hole 185*b*, and the opening 228 may include an edge side surrounding the contact hole 188.

A liquid crystal display will be described with reference to FIGS. 10, 11, 12, and 13 together with the drawings described above with reference to FIG. 6. As previously mentioned, like elements are designated by same reference numerals. Further, duplicative descriptions are omitted to avoid obscuring exemplary embodiments described herein.

Referring to FIGS. 10, 11, 12, and 13, a liquid crystal display may include a lower panel 100 and an upper panel 200 facing each other, and a liquid crystal layer 3 interposed between the two panels 100 and 200.

In the lower panel 100, a gate conductor including the gate line 121 and the horizontal storage electrode line 131 is disposed on the substrate 110.

The gate line 121 includes a first gate electrode 124a, a second gate electrode 124b, and a third gate electrode 124c. The first gate electrode 124a, the second gate electrode 124b, and the third gate electrode 124c may protrude to any one side from a main body of the gate line 121 mainly extending in an x-axis direction. The first gate electrode 124a and the second gate electrode 124b are connected to each other to form one electrode. The third gate electrode 124c is disposed at the left side or the right side of the first and second gate electrodes 124a and 124b. The third gate electrode 124c may protrude from the gate line 121 longer than the protruding lengths of the first and second gate electrodes 124a and 124b.

Since the horizontal storage electrode line 131 is substantially the same as the above described exemplary embodiments, the detailed description is omitted.

A gate insulating layer 140 is disposed on the gate conductor, and a semiconductor layer including a first semiconductor 154a, a second semiconductor 154b, and a third semiconductor 154c is disposed on the gate insulating layer 140. The first semiconductor 154a is disposed on the first gate electrode 124a, the second semiconductor 154b is disposed on the second gate electrode 124b, and the third semiconductor 154c is disposed on the third gate electrode 124c.

An ohmic contact 164 may be disposed on the semiconductor layer.

A data conductor including a plurality of data lines 171 including a first source electrode 173a and a second source electrode 173b, a first drain electrode 175a, a second drain electrode 175b, a third source electrode 173c, a third drain electrode 175c, and a vertical storage electrode line 177 is disposed on the ohmic contact 164 and the gate insulating layer 140.

Figure 10:
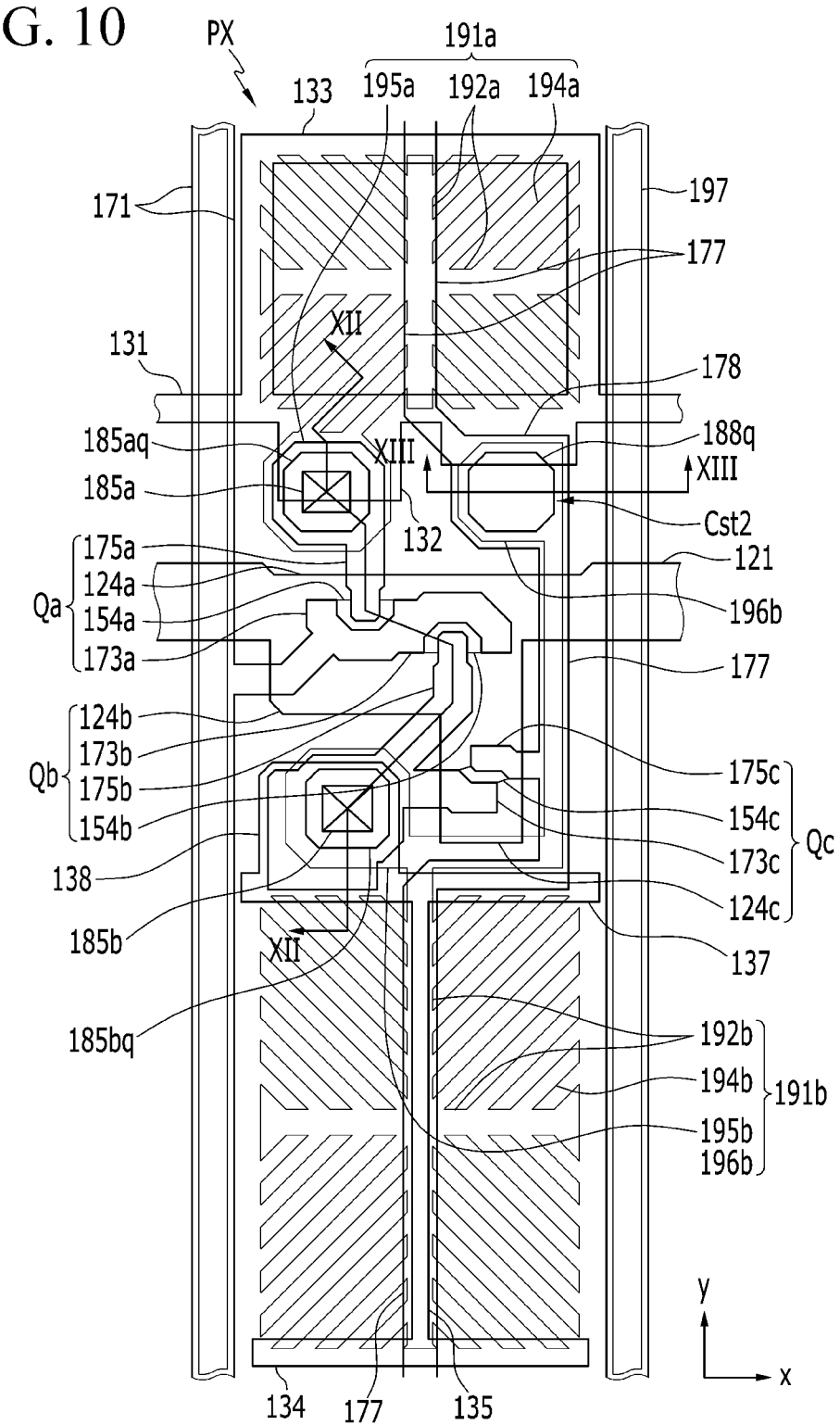
FIG. 10 is a layout view of a pixel of a liquid crystal display, according to one or more exemplary embodiments.
Figure 11:
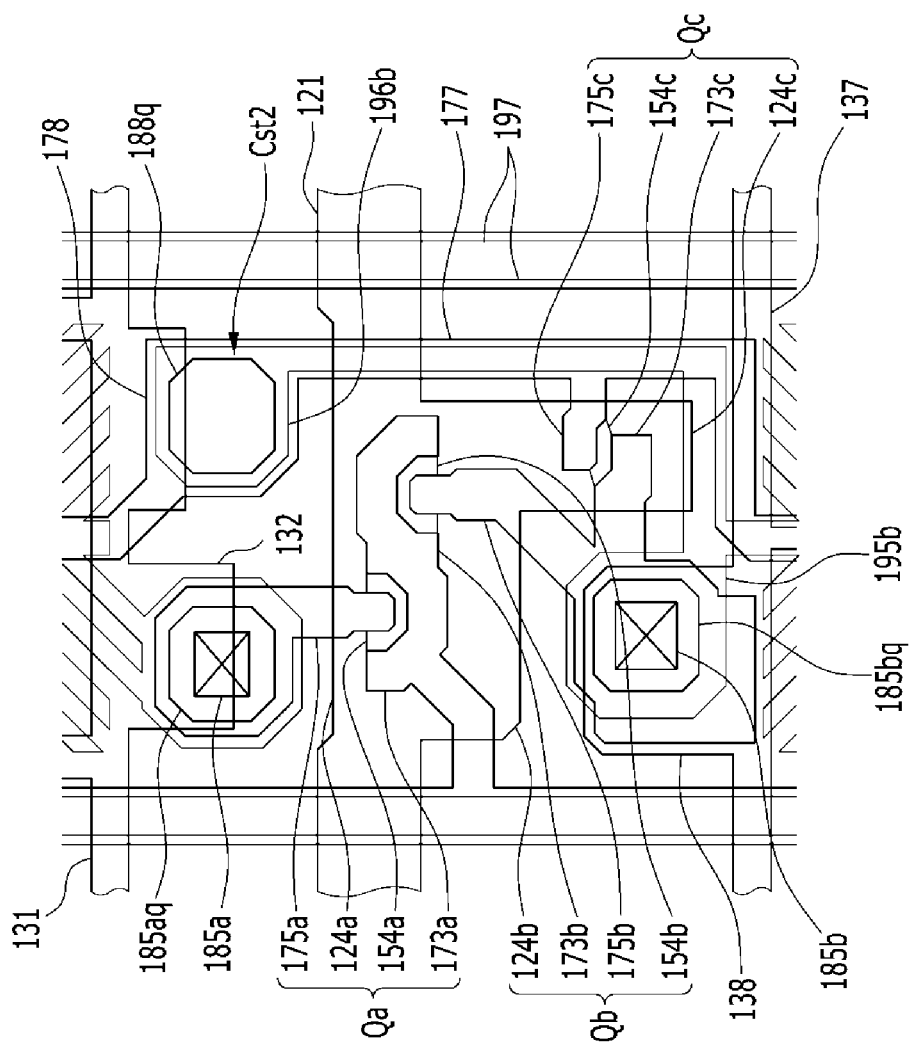
FIG. 11 is an enlarged layout view of a part of a pixel of the liquid crystal display illustrated in FIG. 10, according to one or more exemplary embodiments.

The first source electrode 173a and the second source electrode 173b may be connected to each other. As illustrated in FIGS. 10 and 11, the first source electrode 173a and the second source electrode 173b are connected to each other in the x-axis direction to have a substantial S shape. The first source electrode 173a and the first drain electrode 175a are disposed facing each other with respect to the first gate electrode 124a, and the second source electrode 173b and the second drain electrode 175b are disposed facing each other with respect to the second gate electrode 124b. The first source electrode 173a may face the first drain electrode 175a disposed above, and the second source electrode 173b may face the second drain electrode 175b disposed below. Accordingly, the first drain electrode 175a and the second drain electrode 175b may be disposed at an opposite side with respect to the gate line 121 and disposed substantially symmetrical to each other, and the first drain electrode 175a and the second drain electrode 175b may include portions extending substantially in the y-axis direction.

The third source electrode 173c is connected with second drain electrode 175b. The third source electrode 173c may include a portion extending substantially in the x-axis direction. The third source electrode 173c and the third drain electrode 175c are disposed facing each other with respect to the third gate electrode 124c.

The third drain electrode 175c is connected to the vertical storage electrode line 177.

The vertical storage electrode line 177 extends substantially in the vertical direction, that is, the y-axis direction. Particularly, the vertical storage electrode line 177 may extend along an approximate center line between adjacent data lines 171.

The vertical storage electrode line 177 may be curved at least once around the gate line 121 and the horizontal storage electrode line 131, and may include an expansion 178. The expansion 178 may be disposed facing the third drain electrode 175c, the gate line 121 being disposed between the expansion 178 and the third drain electrode 175c as illustrated in FIGS. 10 and 11. As seen in FIGS. 10 and 11, the expansion 178 may be disposed above the gate line 121. Most of the expansion 178 may be disposed between the horizontal storage electrode line 131 and the gate line 121.

The vertical storage electrode line 177 extends downward from the expansion 178 to cross the gate line 121, be connected with the third drain electrode 175c, and extends downward again in a y-axis direction. The vertical storage electrode line 177 may be curved at least once around the storage electrode 137 and again extend along an approximate center line between the adjacent data lines 171.

The first gate electrode 124a, the first source electrode 173a, and the first drain electrode 175a form a first thin film transistor Qa together with the first semiconductor 154a, the second gate electrode 124b, the second source electrode 173b, and the second drain electrode 175b form a second thin film transistor Qb together with the second semiconductor 154b, and the third gate electrode 124c, the third source electrode 173c, and the third drain electrode 175c form the third thin film transistor Qc together with the third semiconductor 154c.

A lower passivation layer 180p is disposed on the data conductor and exposed portions of the semiconductors 154a, 154b, and 154c. The lower passivation layer 180p includes a contact hole 185a exposing the first drain electrode 175a and a contact hole 185b exposing the second drain electrode 175b.

An insulating layer 180q is disposed on the lower passivation layer 180p. The insulating layer 180q may include an organic insulating material and have substantially a flat upper surface. The insulating layer 180q includes openings 185aq and 185bq corresponding to the contact holes 185a and 185b, respectively, and an opening 188q corresponding to the expansion 178 of the vertical storage electrode line 177. The opening 185aq includes an edge side surrounding the contact hole 185a, and the opening 185bq may include an edge side surrounding the contact hole 185b.

An upper passivation layer 180r may be disposed on the insulating layer 180q. The upper passivation layer 180r may include an inorganic insulating material. The upper passivation layer 180r includes contact holes corresponding to the contact holes 185a and 185b of the lower passivation layer 180p, respectively. The corresponding contact holes of the lower passivation layer 180p and the upper passivation layer 180r may be simultaneously patterned. The upper passivation layer 180q may be omitted.

A pixel electrode including a first subpixel electrode 191a and a second subpixel electrode 191b, and a voltage transfer line 197 are disposed on the upper passivation layer 180r.

Since the shape of the first subpixel electrode 191*a* is substantially the same as that of the exemplary embodiment described above, the detailed description is omitted herein.

The first subpixel electrode 191*a* overlaps with the horizontal storage electrode line 131 and the storage electrodes 132 and 133 included in the horizontal storage electrode line 131 to form a first storage capacitor which serves to maintain the applied voltage. The storage electrode 132 may overlap with the protrusion 195*a* of the first subpixel electrode 191*a*.

The second subpixel electrode 191*b* includes a stem 192*b* having a substantially cross shape, a plurality of minute branches 194*b* extending outward from the stem 192*b*, a protrusion 195*b* extending toward the second drain electrode 175*b*, and a storage protrusion 196*b* extending toward the expansion 176. The protrusion 195*b* is physically and electrically connected with the second drain electrode 175*b* through the contact hole 185*b*.

The second subpixel electrode 191*b* overlaps with the storage electrodes 134, 135, 137, and 138 to form a second storage capacitor Cstb which serves to maintain the applied voltage.

The storage protrusion 196*b* of the second subpixel electrode 191*b* extends upward substantially in the y-axis direction to form an expansion and overlaps with the expansion 178 of the vertical storage electrode line 177. The overlapping portion of the expansion of the storage protrusion 196*b* and the expansion 176 forms the reinforced storage capacitor Cst2 reinforcing the second storage capacitor. The reinforced storage capacitor Cst2 is disposed between the first subpixel electrode 191*a* and the gate line 121 to improve the space application.

Since the storage protrusion 196*b* and the expansion 178 mainly overlap with each other in the opening 188*q* of the insulating layer 180*q*, a distance between the storage protrusion 196*b* and the expansion 178 may be decreased. Since the storage protrusion 196*b* and the expansion 178 are two terminals of the reinforced storage capacitor Cst2 without organic material between the two terminals, the capacitance of the reinforced storage capacitor Cst2 may be increased.

Accordingly, a storage capacitance which is configured to maintain the data voltage received to the second subpixel electrode 191*b* through the second thin film transistor Qb may be increased. Accordingly, a ratio of the parasitic capacitance between the second gate electrode 124*b* and the second drain electrode 175*b* of the second thin film transistor Qb, to the entire capacitance formed by the second subpixel electrode 191*b* and the second drain electrode 175*b* connected to the second subpixel electrode 191*b*, may be further decreased.

In the high-resolution liquid crystal display, the aperture ratio of each pixel PX is decreased, and thus a ratio of the parasitic capacitance between the second gate electrode 124*b* and the second drain electrode 175*b* to the entire capacitance formed by the second subpixel electrode 191*b* and the second drain electrode 175*b* may be increased. According to one or more exemplary embodiments, the ratio of the parasitic capacitance between the second gate electrode 124*b* and the second drain electrode 175*b* and/or the third source electrode 173*c* to the entire capacitance formed by the second subpixel electrode 191*b* and the second drain electrode 175*b* may be decreased by the reinforced storage capacitor Cst2. In the second drain electrode 175*b* and the third source electrode 173*c* which are electrically and physically connected with the second subpixel electrode 191*b*, if the gate signal transferred to the second gate electrode 124*b* drops from the gate-on voltage Von to the gate-off voltage Voff, the voltage of the subpixel electrode 191*b* may drop from capacitive coupling caused by the parasitic capacitance, which is called a kickback voltage. According to one or more exemplary embodiments, the relative ratio of the parasitic capacitance between the second gate electrode 124*b* and the second drain electrode 175*b* and/or the third source electrode 173*c* to the entire capacitance formed by the second subpixel electrode 191*b* and the second drain electrode 175*b* may be decreased by the reinforced storage capacitor Cst2 reinforcing the second storage capacitor, and as a result, the kickback voltage may be decreased.

Furthermore, in liquid crystal displays including multiple thin film transistors to improve visibility, an area occupied by the thin film transistors may be increased, and therefore, the aperture ratio of the pixel PX may be relatively decreased, thus resulting in increasing the kickback voltage. According to one or more exemplary embodiments, a relative ratio of the parasitic capacitance between the second gate electrode 124*b* and the second drain electrode 175*b* to the entire capacitance formed by the second subpixel electrode 191*b* and the second drain electrode 175*b* may be reduced, and thus, the magnitude of the kickback voltage may be reduced by the reinforced storage capacitor Cst2.

Since the magnitude of the kickback voltage may be reduced, a voltage drop applied to the second subpixel electrode 191*b* may be decreased, and liquid crystal display may display an image with luminance of improved accuracy may be displayed. Particularly, when an image with high gray scale value is displayed, the change of luminance due to the kickback voltage of the voltage of the first subpixel electrode 191*b* may be reduced. Since the first subpixel electrode 191*b* occupies a large part of the luminance change of the pixel PX, the deterioration of the luminance of the high-gray image may be reduced and the deterioration of the image quality may be reduced.

Referring to FIGS. 10 and 11, the storage protrusion 196*b* of the second subpixel electrode 191*b* extends along the vertical storage electrode line 177 to overlap with the vertical storage electrode line 177. Particularly, disposing the storage protrusion 196*b* and the vertical storage electrode line 177 configured to transfer a determined voltage where the storage protrusion 196*b* crosses the gate line 121 may limit an additional parasitic capacitor between the gate line 121 and the second subpixel electrode 191*b* from being formed. Accordingly, the voltage drop of the second subpixel electrode 191*b* from the voltage change of the gate line 121 may be decreased. The width of the storage protrusion 196*b* overlapping with the vertical storage electrode line 177 may be relatively smaller than the width of the vertical storage electrode line 177, and the edge side of the storage protrusion 196*b* may be disposed in the area of the vertical storage electrode line 177 overlapping completely covered by the vertical storage electrode line 177. The vertical storage electrode line 177 does not overlap with the third gate electrode 124*c* of the third thin film transistor Qc, but may extend adjacent to the third gate electrode 124*c*.

Furthermore, in the exemplary embodiments, which includes the first to third thin film transistors Qa, Qb, and Qc to improve visibility, the area occupied by the thin film transistors may be increased, and therefore, the aperture ratio of the pixel PX may be relatively decreased, thus resulting in increasing the kickback voltage. According to one or more exemplary embodiments, a relative ratio of the parasitic capacitance between the second gate electrode 124*b* and the second drain electrode 175*b* to the entire capacitance formed by the second subpixel electrode 191*b* and the second drain electrode 175*b* may be reduced, and thus, the magnitude of the kickback voltage may be reduced by the reinforced storage capacitor Cst2.

Referring to FIGS. 10 and 11, the reinforced storage capacitor Cst2 may be disposed between the gate line 121 and the first pixel electrode 191*a* to improve the space application in the high-resolution liquid crystal display.

The voltage transfer line 197 overlaps with the data line 171 and may extend along the data line 171 in a y-axis direction. The voltage transfer line 197 may be configured to transfer a determined voltage. Since the voltage transfer line 197 is disposed on the data line 171, an effect by the voltage change of the data line 171, for example, an effect of capacitive coupling between the data line 171 and the opposing electrode 270 of the upper panel 200, may be reduced. Further, the voltage transfer line 197 may reduce a crosstalk between the data line 171 and the pixel electrode of the pixel PX adjacent to the data line 171. The voltage transfer line 197 may be omitted.

An alignment layer 11 may be disposed on the first and second subpixel electrodes 191*a* and 191*b*. The alignment layer 11 may be a vertical alignment layer. It is noted that the alignment layer 11 may be omitted.

The upper panel 200 may include a light blocking member 220 and a color filter 230, disposed on a substrate 210 facing the substrate 110 of the lower panel 100. At least one of the light blocking member 220 and the color filter 230 may be disposed on the lower panel 100.

An overcoat 250 may be disposed on the color filter 230 and the light blocking member 220. The overcoat 250 may be omitted.

The opposing electrode 270 is disposed on the overcoat 250. The opposing electrode 270 is configured to transfer a determined voltage such as a common voltage Vcom and may receive the determined voltage from the lower panel 100. The opposing electrode 270 may also include a plurality of portions which may be connected to each other on the substrate 210 as a whole plate.

An alignment layer 21 is disposed on the opposing electrode 270 and may be a vertical alignment layer. At least one polarizer (not illustrated) may be disposed on outer surfaces of the panels 100 and 200.

The liquid crystal layer 3 has dielectric anisotropy and includes a plurality of liquid crystal molecules 31. The liquid crystal molecule 31 may be initially aligned in a substantially vertical direction to the substrate 110 without the electric field applied in the microcavity 305. The alignment direction of the liquid crystal molecules 31 may be changed depending on the electric field generated by both the pixel electrode and the opposing electrode 270, and as a result, a polarization state of the light passing through the liquid crystal layer 3 may be changed.

The first and second subpixel electrodes 191*a* and 191*b* may generate the electric field in the liquid crystal layer 3 together with the opposing electrode 270.

The first subpixel electrode 191*a* forms the first liquid crystal capacitor Clca together with the opposing electrode 270, and the second subpixel electrode 191*b* forms the second liquid crystal capacitor Clcb together with the opposing electrode 270 each configured to maintain the charged voltage.

According to one or more exemplary embodiments, a pixel PX may include both the first subpixel electrode 191*a* and the second subpixel electrode 191*b*, but the exemplary embodiments are not limited thereto. A pixel PX may include one subpixel electrode, for example, the second subpixel electrode 191*b* and the reinforced storage capacitor Cst2 may be disposed to reinforce the storage capacitor, such as if the third thin film transistor Qc is omitted.

A liquid crystal display will be described with reference to FIGS. 14, 15, and 16. As previously mentioned, like elements are designated by the same reference numerals. Further, to avoid obscuring exemplary embodiments described herein, duplicative descriptions are omitted.

Figure 12:
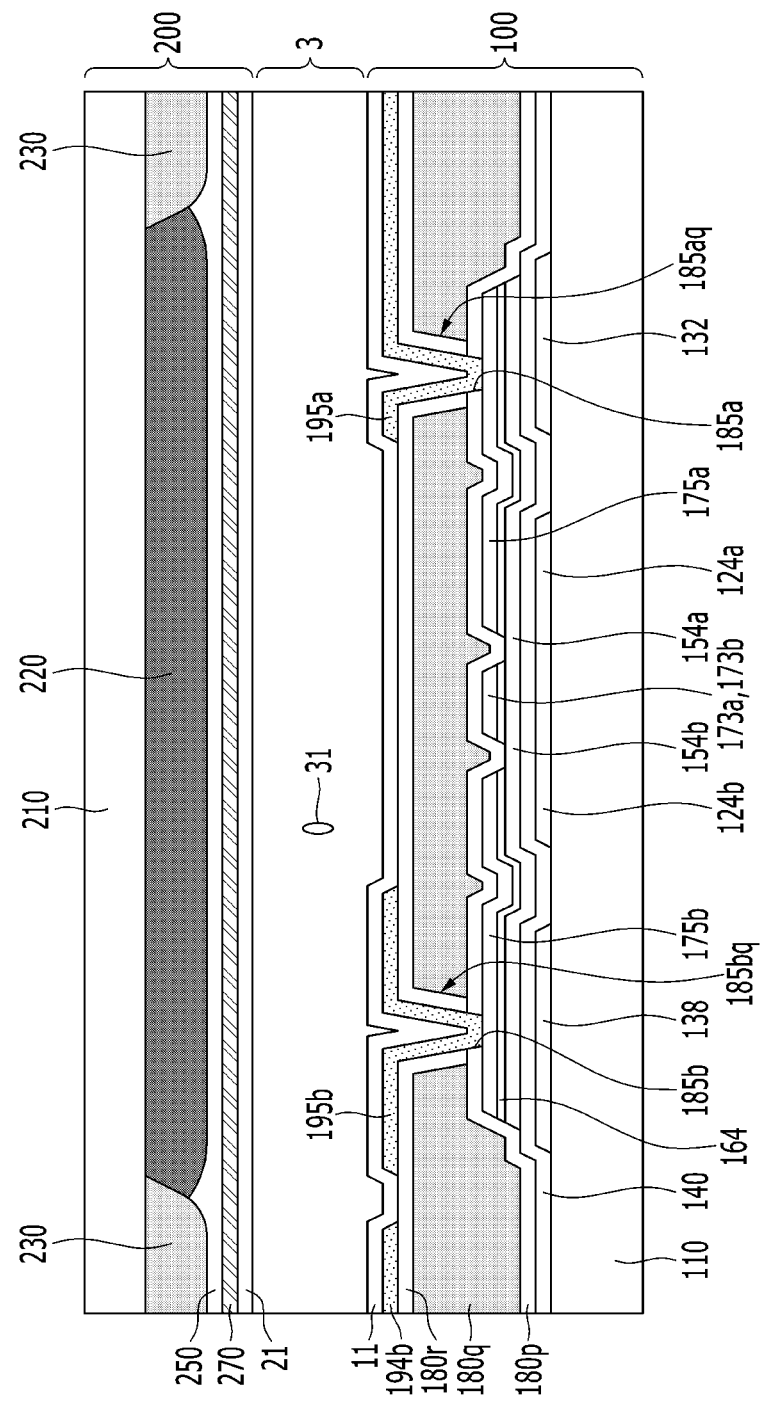
FIG. 12 is a cross-sectional view of the liquid crystal display of FIG. 10 taken along sectional line XII-XII, according to one or more exemplary embodiments.
Figure 13:
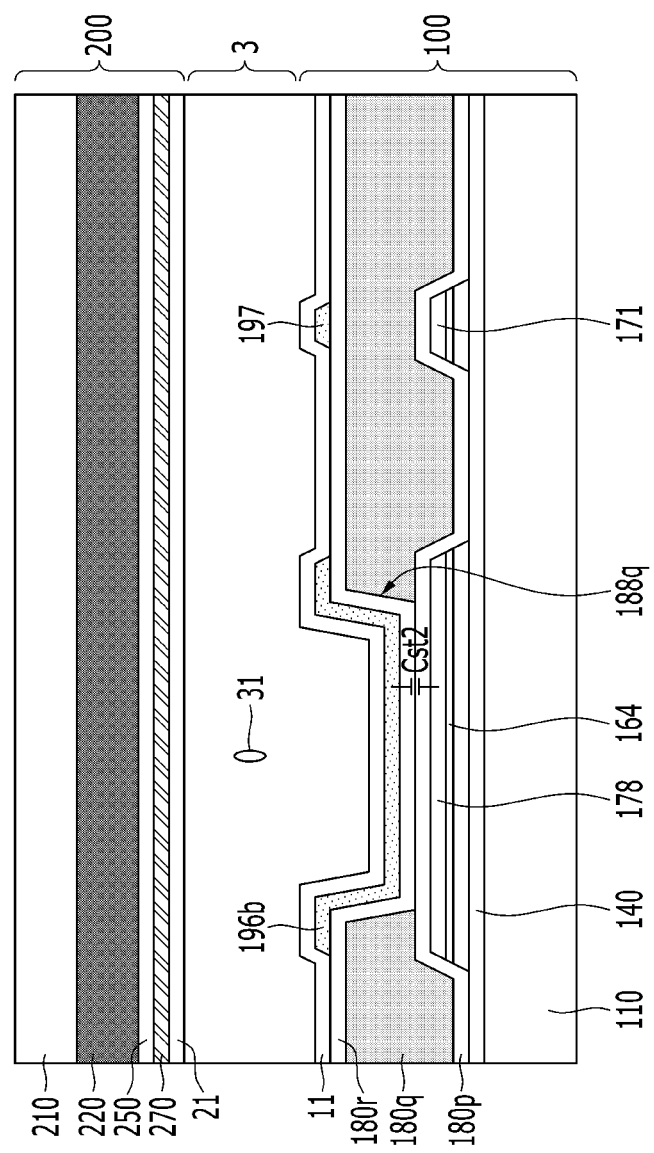
FIG. 13 is a cross-sectional view of the liquid crystal display of FIG. 10 taken along sectional line XIII-XIII, according to one or more exemplary embodiments.
Figure 14:
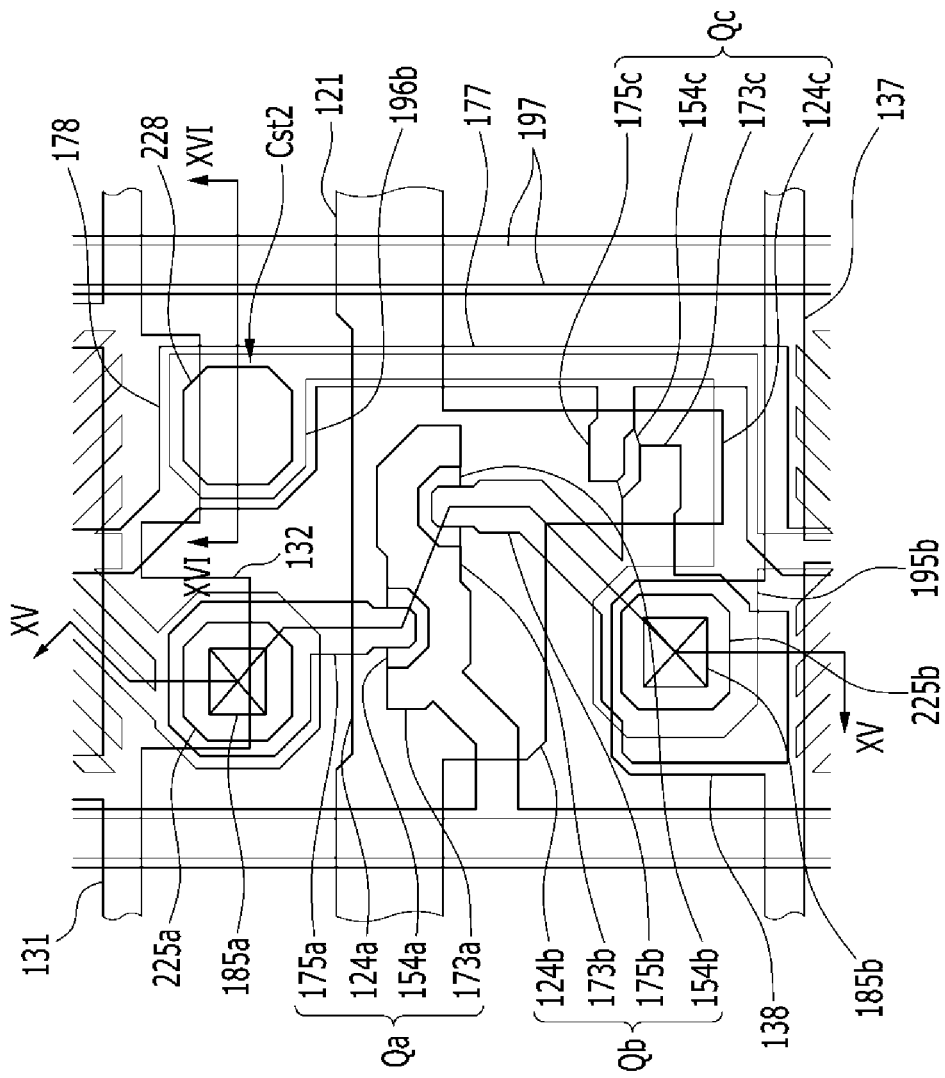
FIG. 14 is a layout view of a pixel of a liquid crystal display, according to one or more exemplary embodiments.
Figure 15:
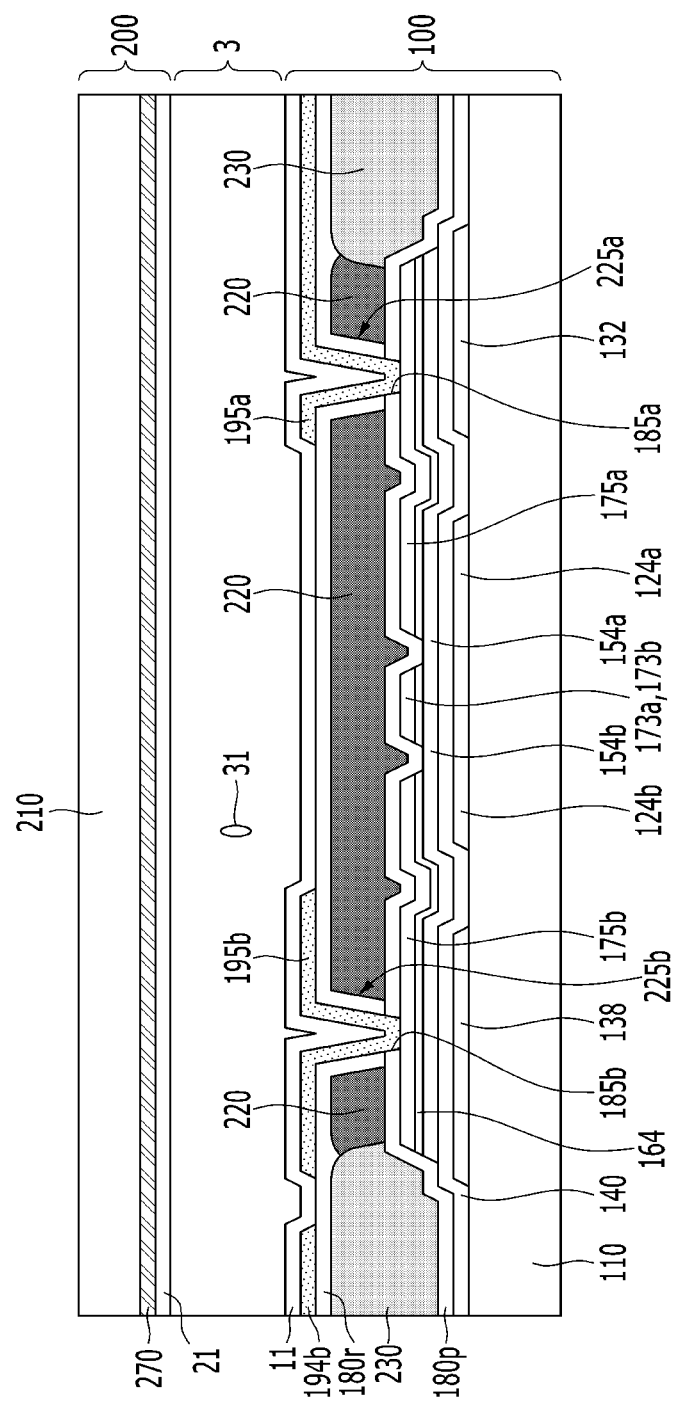
FIG. 15 is a cross-sectional view of the liquid crystal display of FIG. 14 taken along sectional line XV-XV, according to one or more exemplary embodiments.
Figure 16:
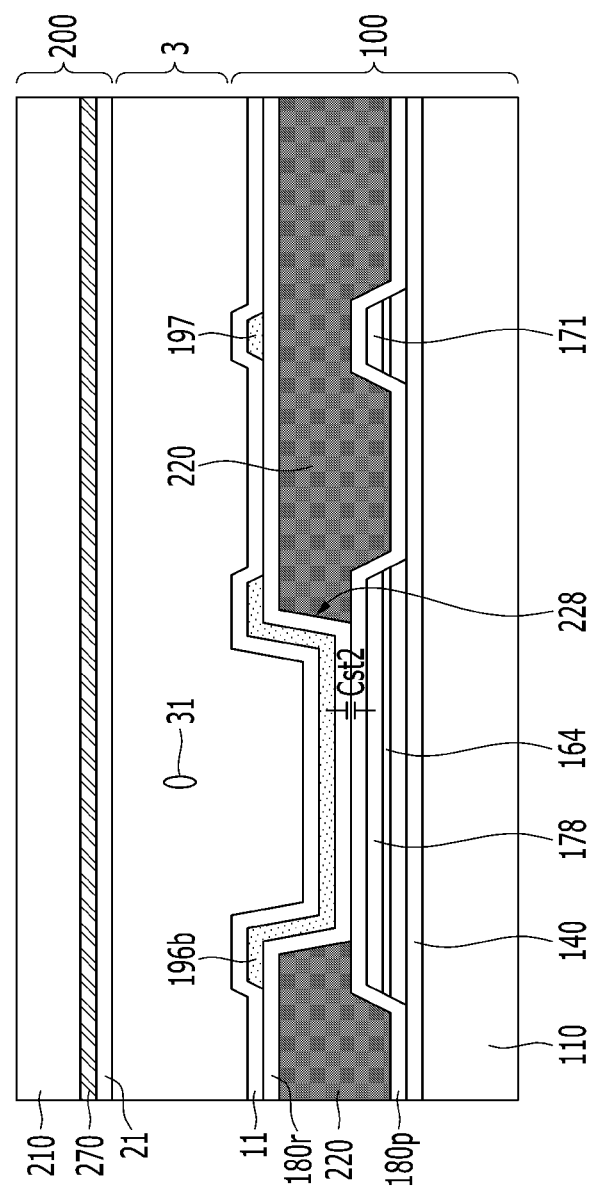
FIG. 16 is a cross-sectional view of the liquid crystal display of FIG. 14 taken along sectional line XVI-XVI, according to one or more exemplary embodiments.

Referring to FIGS. 14, 15, and 16, the liquid crystal display is substantially the same as in FIGS. 10, 12, and 13 described above, except for the light blocking member 220 and the color filter 230. The light blocking member 220 and the color filter 230 instead of the insulating layer 180*q* may be disposed on a lower passivation layer 180*p*. An upper passivation layer 180*r* may be disposed on the light blocking member 220 and the color filter 230.

The color filter 230 may be disposed corresponding to each of the first subpixel electrode 191*a* and the second subpixel electrode 191*b*.

The light blocking member 220 is disposed where the color filters 230 are not disposed, for example, in the light blocking area where the first to third thin film transistors Qa, Qb, and Qc are disposed. The light blocking member 220 may further include a portion extending along the data line 171, overlapping with the data line 171.

The light blocking member 220 includes openings 225*a* and 225*b* corresponding to the contact holes 185*a* and 185*b*, respectively, and an opening 228 corresponding to the expansion 178 of the vertical storage electrode line 177.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A liquid crystal display, comprising:
   a gate line extending in a first direction;
   a first data line extending in a second direction different from the first direction;
   a second data line extending in the second direction;
   a first thin film transistor comprising a first gate electrode connected to the gate line, a first source electrode connected to the first data line, and a first drain electrode;
   a second thin film transistor comprising a second gate electrode connected to the gate line, a second source electrode connected to the first data line, and a second drain electrode;
   a third thin film transistor comprising a third gate electrode connected to the gate line, a third source electrode connected to the second drain electrode, and a third drain electrode;
   a vertical storage electrode line extending between the first data line and the second data line, the vertical storage electrode line being connected to the third drain electrode;
   a horizontal storage electrode line;
   a passivation layer disposed on the first thin film transistor, the second thin film transistor, the third thin film transistor, and the vertical storage electrode line;
   a color filter layer disposed on the passivation layer, the color filter layer comprising a color filter and a light blocking member;
   a first subpixel electrode disposed on the color filter and the light blocking member of the color filter layer and connected to the first drain electrode; and a second subpixel electrode disposed on the color filter layer and connected to the second drain electrode, wherein the first subpixel electrode and the horizontal storage electrode line forms a first storage capacitor, and the second subpixel electrode and the horizontal storage electrode line forms a second storage capacitor, wherein the vertical storage electrode line comprises a first expansion adjacent to the gate line, wherein the light blocking member comprises a first opening exposing a portion of the passivation layer, the portion of the passivation layer overlapping the first expansion, wherein the second subpixel electrode comprises a first protrusion overlapping the first expansion in the first opening in a plan view, a reinforced storage capacitor being formed between the first protrusion and the first expansion, and wherein the horizontal storage electrode line and the vertical storage electrode line are insulated from each other.

2. The liquid crystal display of claim 1, wherein:
the vertical storage electrode line is disposed in the same layer as the first data line and the second data line.

3. The liquid crystal display of claim 2, wherein:
the vertical storage electrode line is configured to transfer a determined voltage.

4. The liquid crystal display of claim 1, wherein:
the reinforced storage capacitor is disposed between the gate line and the third thin film transistor.

5. The liquid crystal display of claim 4, wherein:
the color filter layer includes an organic material.

6. The liquid crystal display of claim 4, wherein:
the first expansion is connected to the third drain electrode.

7. The liquid crystal display of claim 6, wherein:
the third gate electrode comprises a depression corresponding to the first expansion.

8. The liquid crystal display of claim 4, further comprising:
a voltage transfer line disposed in the same layer as the first subpixel electrode and the second subpixel electrode, the voltage transfer line overlapping and extending along the second data line.

9. The liquid crystal display of claim 8, wherein:
the vertical storage electrode line further comprises a second expansion facing the first expansion, the gate line being disposed between the first expansion and the second expansion;
the passivation layer comprises a contact hole exposing the second expansion; and
the voltage transfer line comprises a second protrusion connected to the second expansion via the contact hole.

10. The liquid crystal display of claim 9, wherein:
the vertical storage electrode line is curved at least once around an edge of the first subpixel electrode; and
the vertical storage electrode line is curved at least once around an edge of the second subpixel electrode.

11. The liquid crystal display of claim 9, further comprising:
at least one microcavity facing the first and second subpixel electrodes, the microcavity comprising liquid crystal molecules; and
an opposing electrode facing the first and second subpixel electrodes, the microcavity being disposed between the opposing electrode and the first and second subpixel electrodes, wherein the opposing electrode is connected to the voltage transfer line at or near an edge of the microcavity.

12. The liquid crystal display of claim 11, wherein:
the opposing electrode comprises a first portion spaced apart from a second portion, the gate line being disposed between the first and second portions of the opposing electrode.

13. The liquid crystal display of claim 12, further comprising:
a roof layer disposed on the opposing electrode,
wherein the roof layer faces the first and second subpixel electrodes, and
wherein the microcavity is disposed between the roof layer and the first and second subpixel electrodes.

14. The liquid crystal display of claim 1, wherein:
the gate line is disposed between the reinforced storage capacitor and the third thin film transistor.

15. The liquid crystal display of claim 14, wherein:
the first protrusion comprises a first portion crossing the gate line; and
the vertical storage electrode line comprises a second portion overlapping and extending along the first portion.

16. The liquid crystal display of claim 15, wherein:
a width of the second portion is greater than a width of the first portion.

17. The liquid crystal display of claim 14, wherein:
the vertical storage electrode line is curved at least once around an edge of the first subpixel electrode; and
the vertical storage electrode line is curved at least once around an edge of the second subpixel electrode.

18. The liquid crystal display of claim 14, further comprising:
an opposing electrode facing the first and second subpixel electrodes; and
a liquid crystal layer disposed between the opposing electrode and the first and second subpixel electrodes.

19. A liquid crystal display, comprising:
a gate line extending in a first direction;
a first data line extending in a second direction different from the first direction;
a second data line extending in the second direction;
a first thin film transistor comprising a first gate electrode connected to the gate line, a first source electrode connected to the first data line, and a first drain electrode;
a second thin film transistor comprising a second gate electrode, a second source electrode, and a second drain electrode, the second source electrode connected to the first drain electrode;
a first storage electrode line;
a second storage electrode line extending between the first data line and the second data line, the second storage electrode line being connected to the second drain electrode and configured to transfer a determined voltage;
a passivation layer disposed on the first thin film transistor, the second thin film transistor, and the second storage electrode line;
a color filter layer disposed on the passivation layer, the color filter layer comprising a color filter and a light blocking member; and
a subpixel electrode disposed on the color filter layer, the subpixel electrode being connected to the first drain electrode,
wherein the subpixel electrode and the first storage electrode line forms a storage capacitor, wherein the second storage electrode line comprises an expansion adjacent to the gate line, wherein the light blocking member comprises an opening exposing a portion of the passivation layer, the portion of the passivation layer overlapping the expansion, wherein the subpixel electrode comprises a protrusion overlapping the expansion in the opening in a plan view, a reinforced storage capacitor being formed between the protrusion and the expansion, and wherein the horizontal storage electrode line and the vertical storage electrode line are insulated from each other.

* * * * *